US012648224B2

(12) United States Patent
Kwak et al.

(10) Patent No.: US 12,648,224 B2
(45) Date of Patent: Jun. 2, 2026

(54) DISPLAY DEVICE HAVING BANK DIRECTLY ON AND PARTIALLY IN OPENING OF INSULATING LAYER AND BANK SURROUNDING LIGHT EMITTING ELEMENTS FOR OUTGASSING

(71) Applicant: Samsung Display Co., LTD., Yongin-si (KR)

(72) Inventors: Jin Seon Kwak, Yongin-si (KR); Kyung Bae Kim, Yongin-si (KR); Do Yeong Park, Yongin-si (KR); Yong Hee Lee, Yongin-si (KR); Ji Hye Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 642 days.

(21) Appl. No.: 18/096,705

(22) Filed: Jan. 13, 2023

(65) Prior Publication Data

US 2023/0395614 A1     Dec. 7, 2023

(30) Foreign Application Priority Data

Jun. 7, 2022     (KR) ........................ 10-2022-0069089

(51) Int. Cl.
*H10H 20/813*          (2025.01)
*H10D 86/01*           (2025.01)
          (Continued)

(52) U.S. Cl.
CPC ........... *H10D 86/60* (2025.01); *H10D 86/021* (2025.01); *H10D 86/451* (2025.01);
          (Continued)

(58) Field of Classification Search
CPC .... H10D 86/60; H10D 86/021; H10D 86/451; H10D 86/441; H01L 25/167;
          (Continued)

(56)          References Cited

U.S. PATENT DOCUMENTS 10,170,534  B1 *   1/2019   Kim et al.  .......... H01L 27/3279
12,507,516  B2    12/2025   Lee et al.
          (Continued)

FOREIGN PATENT DOCUMENTS

KR       2018 0060311  A  *  6/2018   ........... H10K 50/844
KR       2020 0063380  A  *  6/2020   ........... H01L 23/552
          (Continued)

*Primary Examiner* — Wael M Fahmy
*Assistant Examiner* — Alice W Tang
(74) *Attorney, Agent, or Firm* — Womble Bond Dickinson (US) LLP

(57)          ABSTRACT

A display device includes electrodes on a base layer; a first insulating layer on the electrodes; a bank on the first insulating layer, protruding in a thickness direction of the base layer, and surrounding a region; light emitting elements in the region on the base layer; and connection electrodes electrically connected to the light emitting elements. The connection electrodes include an anode connection electrode electrically connected to the light emitting elements, a cathode connection electrode electrically connected to the light emitting elements, and an extension connection electrode on the bank. The first insulating layer forms at least one first opening. The at least one first opening overlaps the extension connection electrode in a plan view.

20 Claims, 23 Drawing Sheets

(51) Int. Cl.

| | |
|---|---|
| *H10D 86/40* | (2025.01) |
| *H10D 86/60* | (2025.01) |
| *H10H 20/857* | (2025.01) |
| *H10W 90/00* | (2026.01) |
| *H10H 20/01* | (2025.01) |
| *H10H 20/818* | (2025.01) |

(52) U.S. Cl.
CPC .......... *H10H 20/857* (2025.01); *H10W 90/00* (2026.01); *H10H 20/0364* (2025.01)

(58) Field of Classification Search
CPC .............. H01L 25/0753; H10H 20/857; H10H 20/0364; H10H 20/8512; H10H 20/813; H10H 20/818; H10H 29/142; H10H 20/8314

See application file for complete search history.

(56) References Cited

U.S. PATENT DOCUMENTS

| | | | |
|---|---|---|---|
| 2020/0303676 A1* | 9/2020 | Lin et al. ............ | H01L 51/5253 |
| 2021/0134911 A1* | 5/2021 | Park et al. .......... | H01L 27/3258 |
| 2022/0149111 A1 | 5/2022 | Lee et al. | |
| 2022/0199676 A1* | 6/2022 | Kwak et al. .......... | H01L 27/156 |
| 2023/0197764 A1* | 6/2023 | Lee et al. .............. | H01L 27/156 |
| 2023/0335689 A1 | 10/2023 | Kim et al. | |

FOREIGN PATENT DOCUMENTS

| | | | |
|---|---|---|---|
| KR | 10-2021-0098313 A | 8/2021 | |
| KR | 10-2022-0033544 A | 3/2022 | |
| KR | 10-2022-0062150 A | 5/2022 | |
| KR | 10-2022-0091703 | 7/2022 | |

* cited by examiner

PXL: SPXL1, SPXL2, SPXL3

SPXL: SPXL1, SPXL2, SPXL3
EMA: EMA1, EMA2, EMA3

ALE: ALE_S1, ALE_S2
ELT: ELTA, ELTC

ALE: ALE_S1, ALE_S2
ELT: ELTA, ELTC
INP: INP1, INP2
BNK: BNK1, BNK2

EA1

INP

BNK1

EMU3

LD3

EMU2

LD2

EMA

OP1

OP3

OP2

B'

EMU1

EMU4

LD4

OP1

LD1

ALE1(ALE_S1)

NEA

ALE2(ALE_S2)    ALE3(ALE_S1)

ALE: ALE1, ALE2, ALE3
LD: LD1, LD2, LD3, LD4
EMU: EMU1, EMU2, EMU3

RELT: RELT1, RELT2
ELT: ELT1, ELT2, ELT3, ELT4, ELT5
LD: LD1, LD2, LD3, LD4
EMU: EMU1, EMU2, EMU3

RELT: RELT1, RELT2
ELT: ELT1, ELT2, ELT3, ELT4, ELT5
LD: LD1, LD2, LD3, LD4
EMU: EMU1, EMU2, EMU3

DR2
DR1
DR3

RELT: RELT1, RELT2
ELT: ELT1, ELT2, ELT3, ELT4, ELT5
LD: LD1, LD2, LD3, LD4
EMU: EMU1, EMU2, EMU3

FIG. 16

RELT: RELT1, RELT2
ELT: ELT1, ELT2, ELT3, ELT4, ELT5
LD: LD1, LD2, LD3, LD4
EMU: EMU1, EMU2, EMU3

RELT: RELT1, RELT2
ELT: ELT1, ELT2, ELT3, ELT4, ELT5
LD: LD1, LD2, LD3, LD4
EMU: EMU1, EMU2, EMU3

ALE: ALE_S1, ALE_S2
INS1: INS1_L, INS1_O

DISPLAY DEVICE HAVING BANK DIRECTLY ON AND PARTIALLY IN OPENING OF INSULATING LAYER AND BANK SURROUNDING LIGHT EMITTING ELEMENTS FOR OUTGASSING

CROSS-REFERENCE TO RELATED APPLICATION

The application claims priority to and the benefit of Korean Patent Application No. 10-2022-0069089, filed Jun. 7, 2022, which is hereby incorporated by reference for all purposes as if fully set forth herein.

BACKGROUND

1. Technical Field

The disclosure relates to a display device and a method of manufacturing the same.

2. Description of the Related Art

As the information society develops, the demand for display devices for displaying images is increasing in various forms. For example, display devices may be applied to various electronic devices such as smart phones, digital cameras, notebook computers, navigation devices, and smart televisions.

SUMMARY

An object of the disclosure is to provide a display device in which an outgassing path can be sufficiently secured, and a method of manufacturing the same.

It should be noted that objects of the disclosure are not limited to the above-described objects, and other objects of the disclosure will be apparent to those skilled in the art from the following descriptions.

A display device according to one or more embodiments of the disclosure may include electrodes on a base layer; a first insulating layer on the electrodes; a bank on the first insulating layer, protruding in a thickness direction of the base layer, and surrounding a region; light emitting elements disposed in the region on the base layer; and connection electrodes electrically connected to the light emitting elements. The connection electrodes may include an anode connection electrode electrically connected to the light emitting elements, a cathode connection electrode electrically connected to the light emitting elements, and an extension connection electrode on the bank. The first insulating layer may form at least one first opening. The at least one first opening may overlap the extension connection electrode in a plan view.

According to one or more embodiments, the display device may further include a via layer on the base layer; insulating patterns under the electrodes on the via layer; a second insulating layer, at least a portion of which is on the bank and which forms a second opening exposing the bank; and a third insulating layer, at least a portion of which is on the bank and which forms a third opening exposing the bank. The at least one first opening may expose the insulating patterns.

According to one or more embodiments, each of the via layer, the bank, and the insulating patterns may include an organic material.

According to one or more embodiments, the insulating patterns and the bank may contact each other in the at least one first opening. The insulating patterns and the via layer may contact each other.

According to one or more embodiments, the via layer, the insulating patterns, and the bank may form an outgassing path that allows gas to pass therethrough.

According to one or more embodiments, a portion of the at least one first opening may overlap the second opening in a plan view. Another portion of the at least one first opening may overlap the third opening in a plan view.

According to one or more embodiments, portions of the connection electrodes not on the bank and the extension connection electrode may be disposed to surround a region. The third opening may be in the region.

According to one or more embodiments, the light emitting elements may include a first end and a second end. The at least one first opening may be arranged in a direction from the first end to the second end, and may extend in a direction in which the light emitting elements are sequentially arranged.

According to one or more embodiments, the display device may further include a color conversion layer on the light emitting elements and including quantum dots; and a color filter layer on the light emitting elements and selectively transmitting light of a color.

A display device according to one or more embodiments of the disclosure may include electrodes on a base layer; a first insulating layer on the electrodes and forming at least one first opening; a bank on the first insulating layer and protruding in a thickness direction of the base layer; light emitting elements in a region surrounded by the bank; and a second insulating layer, at least a portion of which is on the first insulating layer and which forms a second opening. The at least one first opening and the second opening may not overlap each other in a plan view.

According to one or more embodiments, the display device may further include a third insulating layer, at least a portion of which is on the second insulating layer and which forms a third opening. The at least one first opening and the third opening may not overlap each other in a plan view.

According to one or more embodiments, the light emitting elements may be sequentially arranged in a direction. The second opening may not be between two of the at least one first opening in the direction, and the third opening may be between the two of the at least one first opening in the direction.

According to one or more embodiments, the at least one first opening may not overlap the light emitting elements in a direction from a first end to a second end of each of the light emitting elements in a plan view.

A method of manufacturing a display device according to one or more embodiments of the disclosure may include disposing a via layer on a base layer; disposing an insulating pattern on the via layer; patterning electrodes on the insulating pattern; disposing a first insulating layer forming at least one first opening on the electrodes and the insulating pattern; disposing a bank protruding in a thickness direction of the base layer on the first insulating layer; disposing light emitting elements in a region surrounded by the bank on the first insulating layer; disposing a second insulating layer forming a second opening on the bank; patterning a first connection electrode electrically connected to the light emitting elements; disposing a third insulating layer forming a third opening; patterning a second connection electrode electrically connected to the light emitting elements; and patterning an extension connection electrode disposed on the bank. The extension connection electrode may overlap the first opening in a plan view.

A portion of the third insulating layer may be on the first connection electrode, and another portion of the third insulating layer may be on the bank.

The extension connection electrode may be integral with the second connection electrode.

According to one or more embodiments, the disposing of the light emitting elements may include providing an electrical signal to the electrodes so that the light emitting elements are aligned based on an electric field according to the electrical signal.

According to one or more embodiments, each of the via layer, the bank, and the insulating pattern may include an organic material.

According to one or more embodiments, the disposing bank may include contacting the bank and the insulating pattern with each other in the first opening. Each of the second opening and the third opening may expose the bank.

According to one or more embodiments, the second opening and the third opening may not overlap each other in a plan view.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts.

FIG. 1 is a perspective view schematically illustrating a light emitting element according to one or more embodiments.

FIG. 2 is a cross-sectional view schematically illustrating the light emitting element according to one or more embodiments.

FIG. 16 is a plan view schematically illustrating a planar structure of a pixel according to a sixth embodiment.

DETAILED DESCRIPTION OF THE EMBODIMENTS

Figure 3:
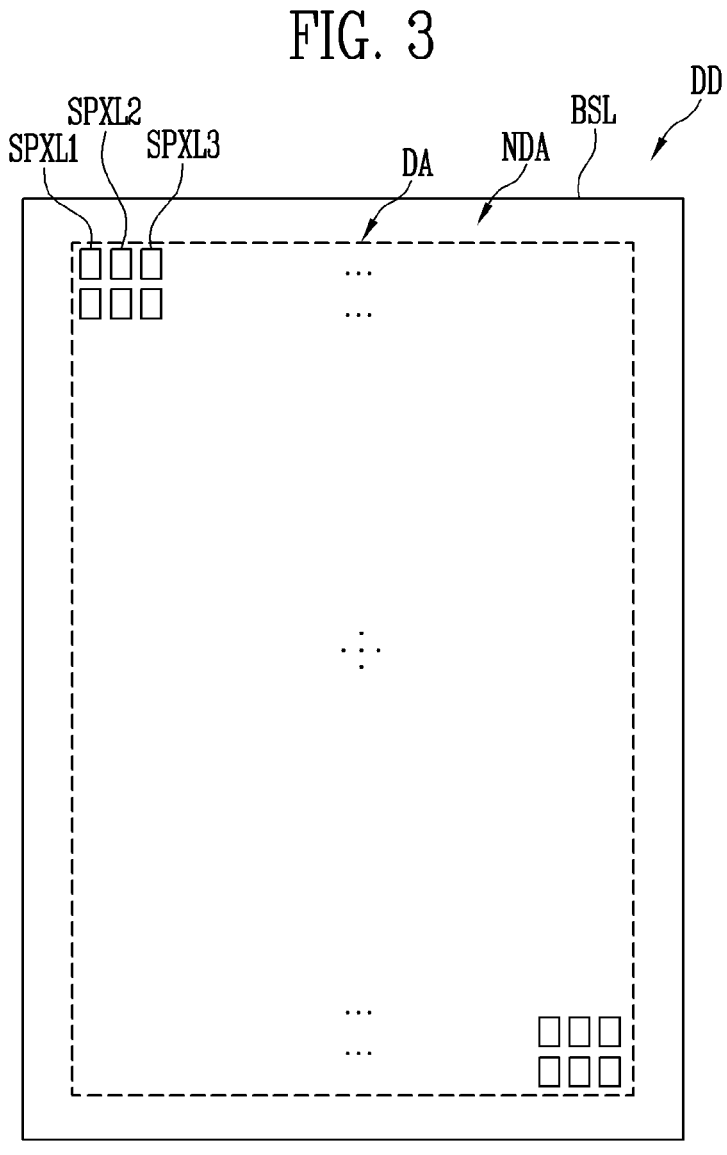
FIG. 3 is a plan view schematically illustrating a display device according to one or more embodiments.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the features and technical scope of the disclosure are encompassed in the disclosure.

It will be understood that, although the terms "first", "second", and the like may be used herein to describe various elements, these elements should not be limited by these terms. These terms are only used to distinguish one element from another element. For instance, a first element discussed below could be termed a second element without departing from the scope of the disclosure. Similarly, the second element could also be termed the first element. In the disclosure, the singular expressions are intended to include the plural expressions as well, unless the context clearly indicates otherwise.

It will be further understood that the terms "comprise", "include", "have", etc. used in the disclosure, specify the presence of stated features, integers, steps, operations, elements, components, or combinations of them but do not preclude the presence or addition of one or more other features, integers, steps, operations, elements, components, or combinations thereof. In addition, when a first part such as a layer, film, region, plate, etc. is "on" a second part, the first part may be not only "directly on" the second part but a third part may intervene between them. Furthermore, in the disclosure, when a first part such as a layer, film, region, plate, etc. is formed on a second part, a direction in which the first part is formed is not limited to an upper direction of the second part, but may include a side or a lower direction of the second part. To the contrary, when a first part such as a layer, film, region, plate, etc. is "under" a second part, the first part may be not only "directly under" the second part but a third part may intervene between them.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

The disclosure relates to a display device and a method of manufacturing the same. Hereinafter, a display device and a method of manufacturing the same according to embodiments will be described with reference to the accompanying drawings.

Figure 1:
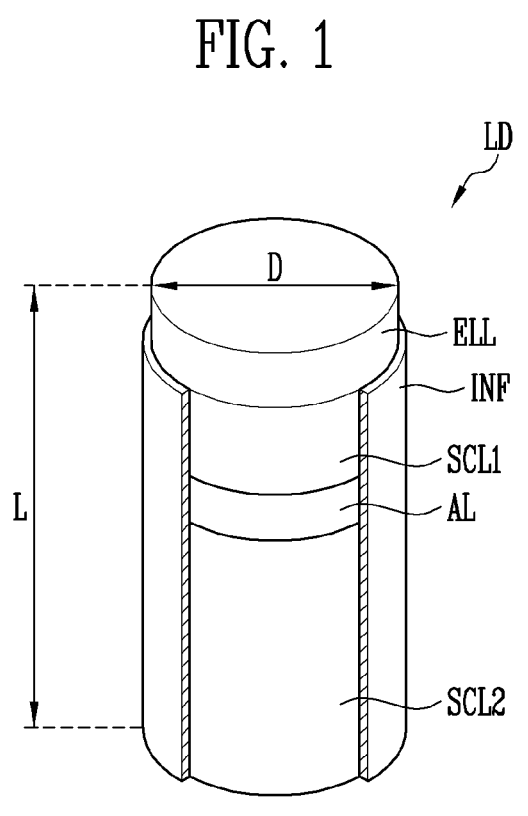
Figure 2:
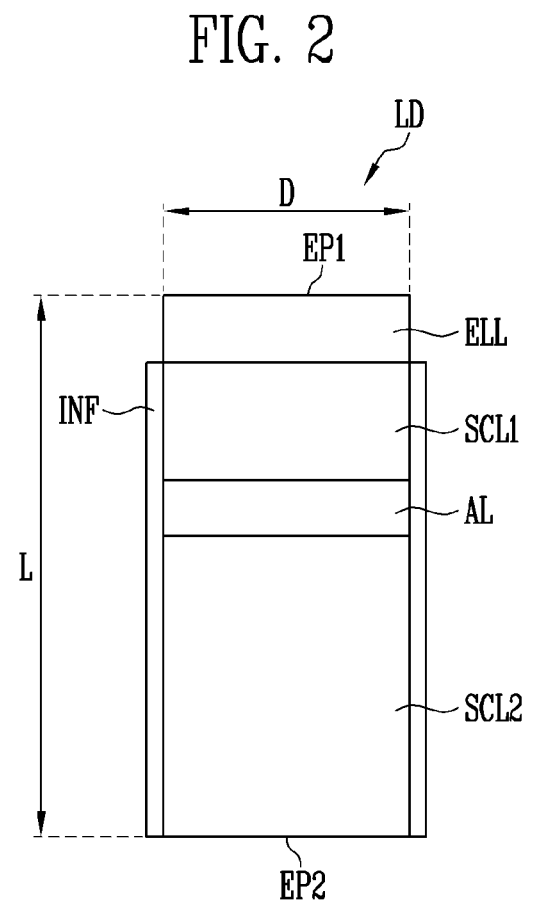

A light emitting element LD according to embodiments will be described with reference to FIGS. 1 and 2. FIG. 1 is a perspective view schematically illustrating a light emitting element according to one or more embodiments. FIG. 2 is a cross-sectional view schematically illustrating the light emitting element according to one or more embodiments.

According to one or more embodiments, the light emitting element LD may be configured to emit light. For example, the light emitting element LD may be a light emitting diode including an inorganic material.

The light emitting element LD may have various shapes. For example, the light emitting element LD may have a shape extending in a direction. According to one or more embodiments, FIGS. 1 and 2 illustrate the light emitting element LD having a columnar shape. However, the type and shape of the light emitting element LD are not limited to the above-described examples.

The light emitting element LD may include a first semiconductor layer SCL1, a second semiconductor layer SCL2, and an active layer AL disposed between the first and second semiconductor layers SCL1 and SCL2. For example, in case that a direction in which the light emitting element LD extends is referred to as a length L direction, the light emitting element LD may include the first semiconductor layer SCL1, the active layer AL, and the second semiconductor layer SCL2 sequentially stacked each other in the length L direction. The light emitting element LD may further include an electrode layer ELL and an element insulating film INF.

The light emitting element LD may be provided in a columnar shape extending in a direction. The light emitting element LD may have a first end EP1 and a second end EP2. The first semiconductor layer SCL1 may be adjacent to the first end EP1 of the light emitting element LD, and the second semiconductor layer SCL2 may be adjacent to the second end EP2 of the light emitting element LD. The electrode layer ELL may be adjacent to the first end EP1.

The light emitting element LD may be a light emitting element manufactured in a columnar shape through an etching process. The columnar shape may include a rod-like shape or a bar-like shape elongated in the length L direction (for example, having an aspect ratio greater than about 1), such as a cylinder or polygonal column, and the shape of the cross-section thereof is not particularly limited. For example, the length L of the light emitting element LD may be greater than the diameter D (or the width of the cross-section).

The light emitting element LD may have a size of nano-scale to micro-scale. For example, the light emitting element LD may have the diameter D (or width) and/or the length L ranging from nano-scale to micro-scale. However, the size of the light emitting element LD is not limited thereto.

The first semiconductor layer SCL1 may be a semiconductor layer of a first conductivity type. The first semiconductor layer SCL1 may be disposed on the active layer AL and may include a semiconductor layer of a different type from that of the second semiconductor layer SCL2. For example, the first semiconductor layer SCL1 may include a P-type semiconductor layer. For example, the first semiconductor layer SCL1 may include a P-type semiconductor layer including at least one semiconductor material of InAlGaN, GaN, AlGaN, InGaN, AlN, and InN and doped with a first conductivity type dopant such as Mg or the like. However, the material constituting the first semiconductor layer SCL1 is not limited thereto, and various other materials may be used to form the first semiconductor layer SCL1.

The active layer AL may be disposed between the first semiconductor layer SCL1 and the second semiconductor layer SCL2, and may have a single-quantum well structure or a multi-quantum well structure. The position of the active layer AL is not limited to a specific example, and may be variously changed according to the type of the light emitting element LD.

A clad layer doped with a conductive dopant may be formed on upper and/or lower portions of the active layer AL. For example, the clad layer may be formed as (or formed of) an AlGaN layer or an InAlGaN layer. According to one or more embodiments, a material such as AlGaN, InAlGaN, or the like may be used to form the active layer AL, and various other materials may be used to form the active layer AL.

The second semiconductor layer SCL2 may be a semiconductor layer of a second conductivity type. The second semiconductor layer SCL2 may be disposed on the active layer AL and may include a semiconductor layer of a different type from that of the first semiconductor layer SCL1. For example, the second semiconductor layer SCL2 may include an N-type semiconductor layer. For example, the second semiconductor layer SCL2 may include an N-type semiconductor layer including at least one semiconductor material of InAlGaN, GaN, AlGaN, InGaN, AlN, and InN and doped with a second conductivity type dopant such as Si, Ge, Sn, or the like. However, the material constituting the second semiconductor layer SCL2 is not limited thereto, and various other materials may be used to form the second semiconductor layer SCL2.

In case that a voltage equal to or greater than a threshold voltage is applied to ends (or both ends) of the light emitting element LD, the light emitting element LD may emit light while electron-hole pairs are combined in the active layer AL. By controlling the light emission of the light emitting element LD using this principle, the light emitting element LD may be used as a light source of various light emitting devices including pixels of a display device.

The element insulating film INF may be disposed on a surface of the light emitting element LD. The element insulating film INF may be formed on the surface of the light emitting element LD to surround at least the outer surface of the active layer AL, and may further surround portions of the first and second semiconductor layers SCL1 and SCL2. The element insulating film INF may be formed as a single layer or a double layer, but the disclosure is not limited thereto, and may include films. For example, the element insulating film INF may include a first insulating film including a first material and a second insulating film including a second material different from the first material.

The element insulating film INF may expose ends of the light emitting element LD having different polarities. For example, the element insulating film INF may expose an end of each of the electrode layer ELL and the second semiconductor layer SCL2 adjacent to the first and second ends EP1 and EP2 of the light emitting element LD.

The element insulating film INF may include at least one insulating material such as silicon oxide (SiOx), silicon nitride (SiNx), silicon oxynitride (SiOxNy), aluminum oxide (AlOx), or titanium oxide (TiOx). The element insulating film INF may have a single-layer or multi-layer structure. However, the disclosure is not limited to the above-described examples. For example, according to another embodiment, the formation of the element insulating film INF may be omitted.

According to embodiments, in case that the element insulating film INF is provided to cover the surface of the light emitting element LD, particularly, the outer surface of the active layer AL, electrical stability of the light emitting element LD can be secured. In case that the element insulating film INF is provided on the surface of the light emitting element LD, lifespan and efficiency can be improved by minimizing surface defects of the light emitting element LD. Even in case that light emitting elements LD are disposed adjacent to each other, it is possible to prevent an unwanted short circuit between the light emitting elements LD.

The electrode layer ELL may be disposed on the first semiconductor layer SCL1. The electrode layer ELL may be adjacent to the first end EP1. The electrode layer ELL may be electrically connected to the first semiconductor layer SCL1.

A portion of the electrode layer ELL may be exposed. For example, the element insulating film INF may expose a surface of the electrode layer ELL. The electrode layer ELL may be exposed in a region corresponding to the first end EP1.

According to one or more embodiments, a side surface of the electrode layer ELL may be exposed. For example, the element insulating film INF may cover side surfaces of the first semiconductor layer SCL1, the active layer AL, and the second semiconductor layer SCL2, but may not cover at least a portion of the side surface of the electrode layer ELL. Electrical connection between the electrode layer ELL adjacent to the first end EP1 and other components may be easy. According to one or more embodiments, the element insulating film INF may expose a portion of the side surface of the first semiconductor layer SCL1 and/or the second semiconductor layer SCL2 as well as the side surface of the electrode layer ELL.

According to one or more embodiments, the electrode layer ELL may be an ohmic contact electrode. However, the disclosure is not limited to the above-described examples. For example, the electrode layer ELL may be a Schottky contact electrode.

According to one or more embodiments, the electrode layer ELL may include at least one of chromium (Cr), titanium (Ti), aluminum (Al), gold (Au), nickel (Ni), an oxide thereof, or an alloy thereof. However, the disclosure is not limited to the above-described examples. According to one or more embodiments, the electrode layer ELL may be substantially transparent. For example, the electrode layer ELL may include indium tin oxide (ITO). Accordingly, the emitted light may pass through the electrode layer ELL.

The structure and shape of the light emitting element LD are not limited to the above-described examples. According to embodiments, the light emitting element LD may have various structures and shapes. For example, the light emitting element LD may further include an additional electrode layer disposed on a surface of the second semiconductor layer SCL2 and adjacent to the second end EP2.

FIG. 3 is a plan view schematically illustrating a display device according to an embodiment.

Referring to FIG. 3, a display device DD may include a base layer BSL and a pixel PXL disposed on the base layer BSL. Although not shown in the drawings, the display device DD may further include a driving circuit (or driving circuit unit or driving circuit part) (for example, a scan driver and a data driver) for driving the pixel PXL, wirings, and pads.

The display device DD may include a display area DA and a non-display area NDA. The non-display area NDA may refer to an area other than the display area DA. The non-display area NDA may surround at least a portion of the display area DA.

The base layer BSL may form a base member of the display device DD. The base layer BSL may be a rigid or flexible substrate or film. For example, the base layer BSL may be a rigid substrate made of glass or tempered glass, a flexible substrate (or thin film) made of plastic or metal, or at least one insulating layer. The material and/or properties of the base layer BSL are not particularly limited. According to one or more embodiments, the base layer BSL may be substantially transparent. The term "substantially transparent" may mean that light can be transmitted with a predetermined or selected transmittance or more. In another embodiment, the base layer BSL may be translucent or opaque. Also, the base layer BSL may include a reflective material according to one or more embodiments.

The display area DA may refer to an area in which the pixel PXL is disposed. The non-display area NDA may refer to an area in which the pixel PXL is not disposed. The driving circuit, the wirings, and the pads connected to the pixel PXL of the display area DA may be disposed in the non-display area NDA.

According to an example, the pixel PXL may be arranged according to a stripe or PENTILE™ arrangement structure. However, the disclosure is not limited thereto, and various embodiments may be applied to the disclosure.

According to embodiments, the pixel PXL may include a first sub-pixel SPXL1, a second sub-pixel SPXL2, and a third sub-pixel SPXL3. Each of the first sub-pixel SPXL1, the second sub-pixel SPXL2, and the third sub-pixel SPXL3 may be a sub-pixel. The first sub-pixel SPXL1, the second sub-pixel SPXL2, and the third sub-pixel SPXL3 may form a pixel part capable of emitting light of various colors.

For example, each of the first sub-pixel SPXL1, the second sub-pixel SPXL2, and the third sub-pixel SPXL3 may emit light of a color (e.g., a predetermined or selectable color). For example, the first sub-pixel SPXL1 may be a red pixel emitting red (for example, a first color) light, the second sub-pixel SPXL2 may be a green pixel emitting green (for example, a second color) light, and the third sub-pixel SPXL3 may be a blue pixel emitting blue (for example, a third color) light. According to one or more embodiments, the number of second sub-pixels SPXL2 may be greater than the number of first sub-pixels SPXL1 and the number of third sub-pixels SPXL3. However, the color, type and/or number of the first sub-pixels SPXL1, the second sub-pixels SPXL2, and the third sub-pixels SPXL3 constituting the pixel part are not limited to specific examples.

The pixel PXL (or sub-pixel SPXL) according to embodiments will be described with reference to FIGS. 4 to 8. FIGS. 4 to 8 are schematic diagrams illustrating the pixel PXL (or sub-pixel SPXL) according to embodiments. Contents that may be repetitive with respect to the above-described contents will be briefly described or will not be repeatedly described.

Figure 4:
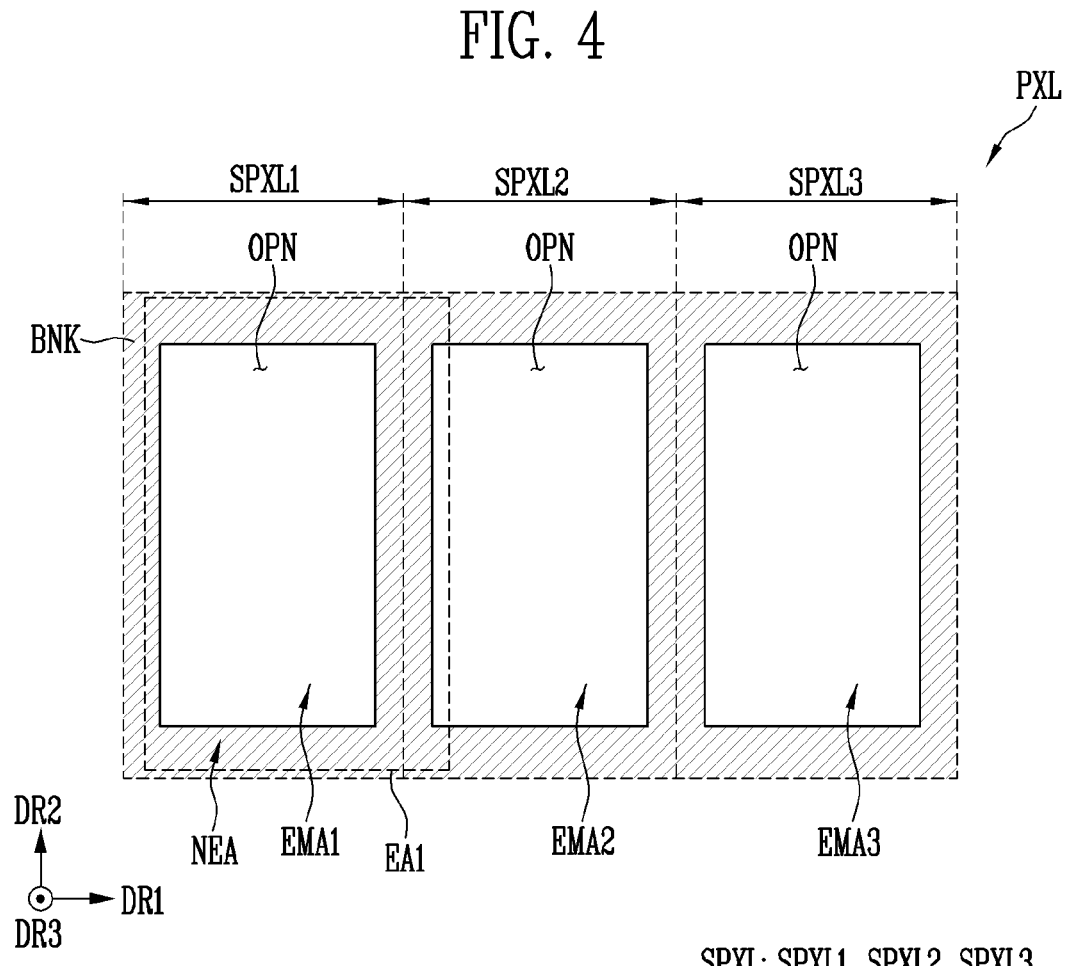
FIG. 4 is a plan view schematically illustrating a pixel according to one or more embodiments.
Figure 5:
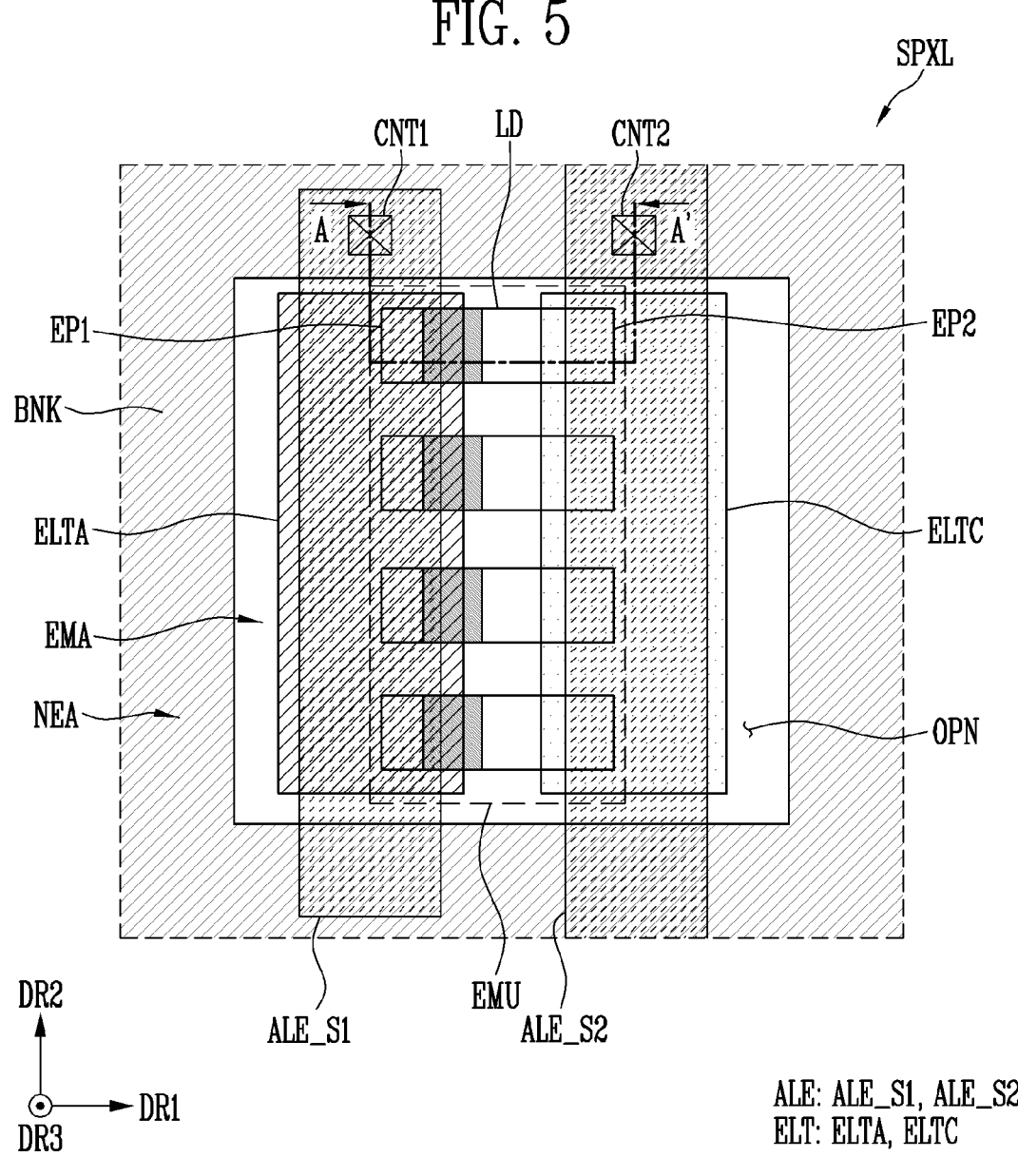
FIG. 5 is a plan view schematically illustrating a sub-pixel according to one or more embodiments.

First, a planar structure of the pixel PXL (or sub-pixel SPXL) will be described with reference to FIGS. 4 and 5. FIG. 4 is a plan view schematically illustrating a pixel according to an embodiment. FIG. 5 is a plan view schematically illustrating a sub-pixel according to an embodiment. The sub-pixel SPXL may be at least one of the first to third sub-pixels SPXL1, SPXL2, and SPXL3 described above with reference to FIG. 3.

FIG. 4 illustrates an embodiment in which the first to third sub-pixels SPXL1, SPXL2, and SPX3 are sequentially arranged, and FIG. 5 illustrates a planar structure of at least one of the sub-pixels SPXL.

The pixel PXL (or each of the sub-pixels SPXL) may include a bank BNK, electrodes ALE, the light emitting element LD, and connection electrodes ELT.

The pixel PXL may include emission areas EMA and a non-emission area NEA. For example, the first sub-pixel SPXL1 may include a first emission area EMA1 that is at least one of the emission areas EMA and the non-emission area NEA. The second sub-pixel SPXL2 may include a second emission area EMA2 that is at least one of the emission areas EMA and the non-emission area NEA. The third sub-pixel SPXL3 may include a third emission area EMA3 that is at least one of the emission areas EMA and the non-emission area NEA.

An emission area EMA may overlap a bank opening OPN defined by the bank BNK in a plan view. According to one or more embodiments, the light emitting elements LD may be disposed in the emission areas EMA, and light emitted from the light emitting elements LD may be provided from the emission areas EMA.

The light emitting elements LD may not be disposed in the non-emission area NEA. A portion of the non-emission area NEA may overlap the bank BNK in a plan view.

The bank BNK may form (or provide) the bank opening OPN. For example, the bank BNK may have a shape that protrudes in a thickness direction (for example, a third direction DR3) of the base layer BSL and surrounds a region (e.g., a predetermined or selectable region). Accordingly, the bank opening OPN in which the bank BNK is not disposed may be formed.

The bank BNK may form a space. The bank BNK may have a shape surrounding a region in a plan view. The space may mean a region in which a fluid may be accommodated. According to one or more embodiments, the bank BNK may include a first bank BNK1 and a second bank BNK2 (refer to FIG. 6).

According to one or more embodiments, by providing ink INK (refer to FIG. 20) including the light emitting element LD in the space defined by the bank BNK (for example, the first bank BNK1), the light emitting element LD may be disposed in the bank opening OPN.

According to one or more embodiments, a color conversion layer CCL (refer to FIG. 7) may be disposed (or patterned) in the space defined by the bank BNK (for example, the second bank BNK2).

The bank BNK may define the emission area EMA and the non-emission area NEA. The bank BNK may surround at least a portion of the emission area EMA in a plan view. For example, an area in which the bank BNK is disposed may be the non-emission area NEA. As an area in which the bank BNK is not disposed, the area in which the light emitting element LD is disposed may be the emission area EMA.

The electrodes ALE may be electrodes for aligning the light emitting elements LD. According to one or more embodiments, the electrodes ALE may include a first alignment electrode ALE_S1 and a second alignment electrode ALE_S2. Each of the electrodes ALE may be referred to as an alignment electrode.

The electrodes ALE may have a single-layer or multi-layer structure. For example, the electrodes ALE may include at least one reflective electrode layer including a reflective conductive material, and optionally further include at least one transparent electrode layer and/or at least one conductive capping layer. According to one or more embodiments, the electrodes ALE may include at least one of silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the disclosure is not limited to the above-described examples, and the electrodes ALE may include at least one of various materials having reflectivity.

The light emitting element LD may be disposed on the electrodes ALE. According to one or more embodiments, at least a portion of the light emitting element LD may be disposed between the first alignment electrode ALE_S1 and the second alignment electrode ALE_S2. The light emitting element LD may be aligned between the first alignment electrode ALE_S1 and the second alignment electrode ALE_S2. The light emitting elements LD may form (or constitute) an emission part (or emission unit) EMU. The emission part EMU may refer to a part including light emitting elements LD adjacent to each other.

According to one or more embodiments, the light emitting element LD may be aligned in various ways. For example, FIG. 5 illustrates an embodiment in which the light emitting elements LD are arranged in parallel between the first alignment electrode ALE_S1 and the second alignment electrode ALE_S2. However, the disclosure is not limited to the above-described examples. For example, the light emitting elements LD may be arranged in a series structure or a series/parallel mixed structure, and the number of parts connected in series and/or in parallel is not particularly limited. For example, the light emitting elements LD may form a structure in which four parallel structures are connected in series. This will be described below with reference to the drawings after FIG. 9.

The first alignment electrode ALE_S1 and the second alignment electrode ALE_S2 may be spaced apart from each other. For example, the first alignment electrode ALE_S1 and the second alignment electrode ALE_S2 may be spaced apart from each other in a first direction DR1 in the emission area EMA and may extend in a second direction DR2.

The first alignment electrode ALE_S1 and the second alignment electrode ALE_S2 may receive a first alignment signal and a second alignment signal, respectively, in a process step in which the light emitting elements LD are aligned. For example, the ink INK including the light emitting element LD may be supplied (or provided) to the bank opening OPN defined by the bank BNK (for example, the first bank BNK1), the first alignment signal may be supplied to the first alignment electrode ALE_S1, and the second alignment signal may be supplied to the second alignment electrode ALE_S2. The first alignment signal and the second alignment signal may have different waveforms, potentials, and/or phases. For example, the first alignment signal may be an AC signal, and the second alignment signal may be a ground signal. However, the disclosure is not limited to the above-described examples. An electric field may be formed between (or on) the first alignment electrode ALE_S1 and the second alignment electrode ALE_S2, and the light emitting elements LD may be aligned between the first alignment electrode ALE_S1 and the second alignment electrode ALE_S2 based on the electric field. For example, the light emitting elements LD may be moved (or rotated) by a force (for example, a dielectrophoresis (DEP) force) according to the electric field and aligned (or disposed) on the electrodes ALE.

The first alignment electrode ALE_S1 may be electrically connected to a circuit element (for example, a transistor TR (refer to FIG. 6)) through a first contact member CNT1. According to one or more embodiments, the first alignment electrode ALE_S1 may provide an anode signal so that the light emitting element LD may emit light. The first alignment electrode ALE_S1 may provide the first alignment signal for aligning the light emitting element LD.

The second alignment electrode ALE_S2 may be electrically connected to a power source line PL (refer to FIG. 6) through a second contact member CNT2. According to one or more embodiments, the second alignment electrode ALE_S2 may provide a cathode signal so that the light emitting element LD may emit light. The second alignment electrode ALE_S2 may provide the second alignment signal for aligning the light emitting element LD.

The positions of the first contact member CNT1 and the second contact member CNT2 are not limited to the positions shown in FIG. 5 and may be appropriately changed in various ways.

The light emitting element LD may emit light based on the provided electrical signal. For example, the light emitting element LD may emit light based on a first electrical signal (for example, the anode signal) provided from an anode connection electrode ELTA and a second electrical signal (for example, the cathode signal) provided from a cathode connection electrode ELTC.

The first end EP1 of the light emitting element LD may be disposed adjacent to the first alignment electrode ALE_S1, and the second end EP2 of the light emitting element LD may be disposed adjacent to the second alignment electrode ALE_S2. The first end EP1 may or may not overlap the first alignment electrode ALE_S1. The second end EP2 may or may not overlap the second alignment electrode ALE_S2.

According to one or more embodiments, the first end EP1 of each of the light emitting elements LD may be electrically connected to the first alignment electrode ALE_S1 through the anode connection electrode ELTA. In another embodiment, the first end EP1 of each of the light emitting elements LD may be directly connected to the first alignment electrode ALE_S1. In another embodiment, the first end EP1 of each of the light emitting elements LD may be electrically connected only to the anode connection electrode ELTA and may not be connected to the first alignment electrode ALE_S1.

Similarly, the second end EP2 of each of the light emitting elements LD may be electrically connected to the second alignment electrode ALE_S2 through the cathode connection electrode ELTC. In another embodiment, the second end EP2 of each of the light emitting elements LD may be directly connected to the second alignment electrode ALE_S2. In another embodiment, the second end EP2 of each of the light emitting elements LD may be electrically connected only to the cathode connection electrode ELTC and may not be connected to the second alignment electrode ALE_S2.

The anode connection electrode ELTA and the cathode connection electrode ELTC may be disposed on first ends EP1 and second ends EP2 of the light emitting elements LD, respectively.

The anode connection electrode ELTA may be disposed on the first ends EP1 to be electrically connected to the first ends EP1 of the light emitting elements LD. In one or more embodiments, the anode connection electrode ELTA may be disposed on the first alignment electrode ALE_S1 to be electrically connected to the first alignment electrode ALE_S1. The first ends EP1 of the light emitting elements LD may be connected to the first alignment electrode ALE_S1 through the anode connection electrode ELTA.

The cathode connection electrode ELTC may be disposed on the second ends EP2 to be electrically connected to the second ends EP2 of the light emitting elements LD. In one or more embodiments, the cathode connection electrode ELTC may be disposed on the second alignment electrode ALE_S2 to be electrically connected to the second alignment electrode ALE_S2. The second ends EP2 of the light emitting elements LD may be connected to the second alignment electrode ALE_S2 through the cathode connection electrode ELTC.

A cross-sectional structure of the pixel PXL (or sub-pixel SPXL) according to one or more embodiments will be described with reference to FIGS. 6 to 8. A pixel circuit layer PCL and a display element layer DPL of the sub-pixel SPXL will be described with reference to FIG. 6. An optical layer OPL, a color filter layer CFL, and an outer film layer OFL will be described with reference to FIGS. 7 and 8. Contents that may be repetitive with respect to the above-described contents will be briefly described or will not be repeatedly described.

Figure 6:
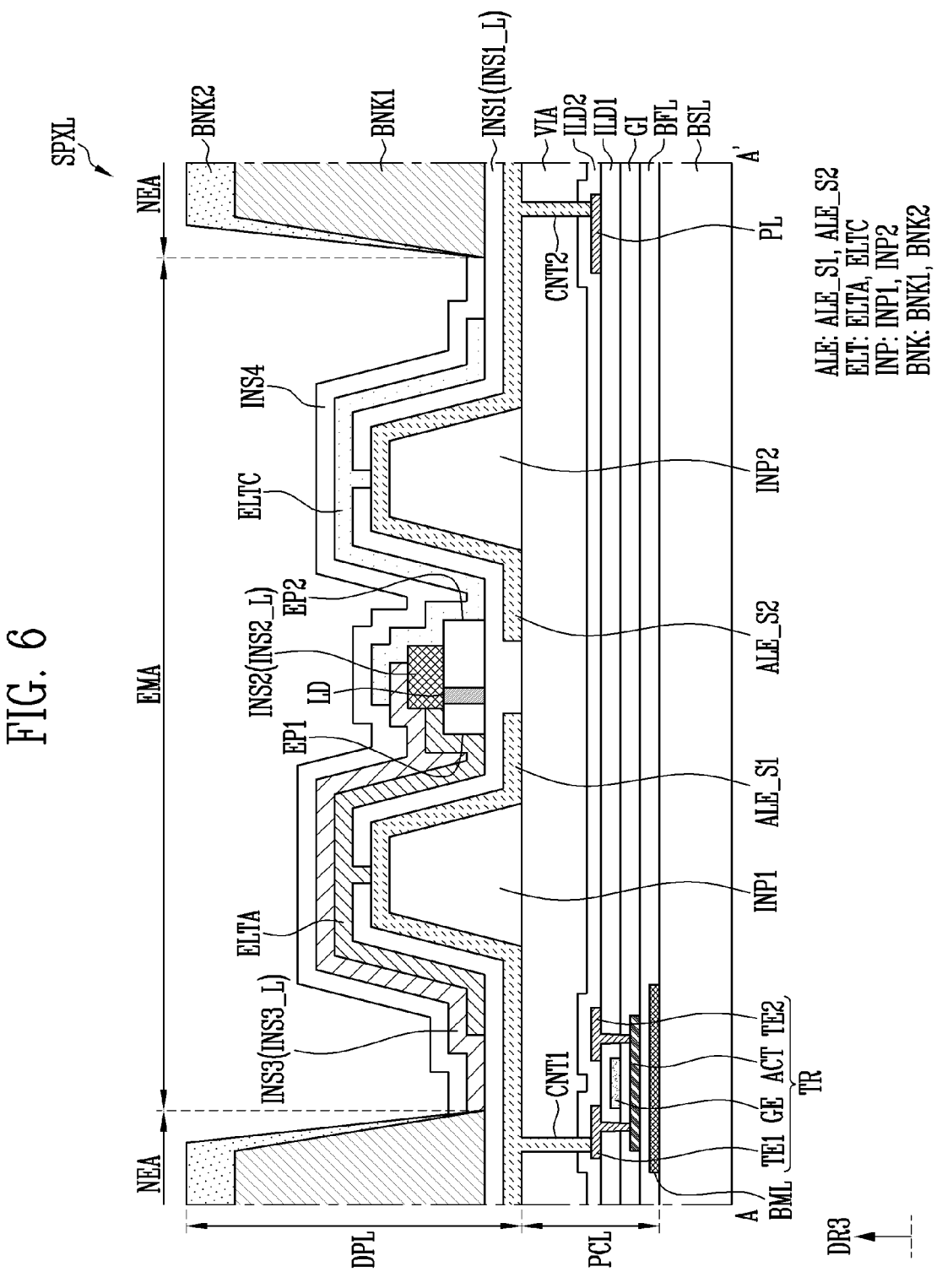
FIG. 6 is a cross-sectional view taken along line A-A' of FIG. 5.

FIG. 6 is a cross-sectional view schematically illustrating the pixel PXL (or sub-pixel SPXL) according to one or more embodiments. FIG. 6 is a schematic cross-sectional view taken along line A-A' of FIG. 5. FIG. 7 is a cross-sectional view schematically illustrating a pixel according to one or more embodiments. FIG. 8 is a cross-sectional view schematically illustrating a sub-pixel according to one or more embodiments.

Referring to FIG. 6, the sub-pixel SPXL may be disposed on the base layer BSL. The sub-pixel SPXL may include the pixel circuit layer PCL and the display element layer DPL.

The base layer BSL may form a base member on which the sub-pixel SPXL is to be formed. The base layer BSL may provide an area in which the pixel circuit layer PCL and the display element layer DPL are to be disposed.

The pixel circuit layer PCL may be disposed on the base layer BSL. The pixel circuit layer PCL may include a lower auxiliary electrode BML, a buffer layer BFL, the transistor TR, a gate insulating layer GI, a first interlayer insulating layer ILD1, a second interlayer insulating layer ILD2, and a via layer VIA.

The lower auxiliary electrode BML may be disposed on the base layer BSL. The lower auxiliary electrode BML may function as a path through which an electrical signal is transmitted. According to one or more embodiments, a portion of the lower auxiliary electrode BML may overlap the transistor TR in a plan view.

The buffer layer BFL may be disposed on the base layer BSL. The buffer layer BFL may cover the lower auxiliary electrode BML. The buffer layer BFL may prevent impurities from diffusing from outside. The buffer layer BFL may include at least one of silicon oxide (SiOx), silicon nitride (SiNx), silicon oxynitride (SiOxNy), aluminum oxide (AlOx), and titanium oxide (TiOx). However, the disclosure is not limited to the above-described examples.

The transistor TR may be a thin-film transistor. According to one or more embodiments, the transistor TR may be a driving transistor. The transistor TR may be electrically connected to the light emitting element LD. The transistor TR may be electrically connected to the first end EP1 of the light emitting element LD.

The transistor TR may include an active layer ACT, a first transistor electrode TE1, a second transistor electrode TE2, and a gate electrode GE.

The active layer ACT may refer to a semiconductor layer. The active layer ACT may be disposed on the buffer layer BFL. The active layer ACT may include at least one selected from the group consisting of polysilicon, low-temperature polycrystalline silicon (LTPS), amorphous silicon, and an oxide semiconductor.

The active layer ACT may include a first contact region contacting the first transistor electrode TE1 and a second contact region contacting the second transistor electrode TE2. The first contact region and the second contact region may be semiconductor patterns doped with impurities. A region between the first contact region and the second contact region may be a channel region. The channel region may be an intrinsic semiconductor pattern not doped with impurities.

The gate electrode GE may be disposed on the gate insulating layer GI. The position of the gate electrode GE may correspond to the position of the channel region of the active layer ACT. For example, the gate electrode GE may be disposed on the channel region of the active layer ACT with the gate insulating layer GI interposed therebetween.

The gate insulating layer GI may be disposed on the buffer layer BFL. The gate insulating layer GI may cover the active layer ACT. The gate insulating layer GI may include at least one of silicon oxide (SiOx), silicon nitride (SiNx), silicon oxynitride (SiOxNy), aluminum oxide (AlOx), and titanium oxide (TiOx). However, the disclosure is not limited to the above-described examples.

The first interlayer insulating layer ILD1 may be disposed on the gate insulating layer GI. The first interlayer insulating layer ILD1 may cover the gate electrode GE. The first interlayer insulating layer ILD1 may include at least one of silicon oxide (SiOx), silicon nitride (SiNx), silicon oxynitride (SiOxNy), aluminum oxide (AlOx), and titanium oxide (TiOx). However, the disclosure is not limited to the above-described examples.

The first transistor electrode TE1 and the second transistor electrode TE2 may be disposed on the first interlayer insulating layer ILD1. The first transistor electrode TE1 may pass through the gate insulating layer GI and the first interlayer insulating layer ILD1 to contact the first contact region of the active layer ACT. The second transistor electrode TE2 may pass through the gate insulating layer GI and the first interlayer insulating layer ILD1 to contact the second contact region of the active layer ACT. For example, the first transistor electrode TE1 may be a drain electrode and the second transistor electrode TE2 may be a source electrode, but the disclosure is not limited thereto.

The first transistor electrode TE1 may be electrically connected to the first alignment electrode ALE_S1 through the first contact member CNT1 penetrating the via layer VIA and the second interlayer insulating layer ILD2.

The power source line PL may be disposed on the first interlayer insulating layer ILD1. According to one or more embodiments, the power source line PL, the first transistor electrode TE1, and the second transistor electrode TE2 may be disposed on a same layer. The power source line PL may be electrically connected to the second alignment electrode ALE_S2 through the second contact member CNT2. The power source line PL may supply a power source or an alignment signal through the second alignment electrode ALE_S2.

The second interlayer insulating layer ILD2 may be disposed on the first interlayer insulating layer ILD1. The second interlayer insulating layer ILD2 may cover the first transistor electrode TE1, the second transistor electrode TE2, and the power source line PL. The second interlayer insulating layer ILD2 may include at least one of silicon oxide (SiOx), silicon nitride (SiNx), silicon oxynitride (SiOxNy), aluminum oxide (AlOx), and titanium oxide (TiOx). However, the disclosure is not limited to the above-described examples.

The via layer VIA may be disposed on the second interlayer insulating layer ILD2. According to one or more embodiments, the via layer VIA may include an organic material in order to planarize the step difference (or thickness or height difference) thereunder. For example, the via layer VIA may include an organic material such as an acrylates resin, an epoxy resin, a phenolic resin, a polyamides resin, a polyimides resin, a polyester resin, a polyphenylenesulfides resin or benzocyclobutene (BCB). According to one or more embodiments, the via layer VIA may include an organic material and may function as a path for discharging gas G (refer to FIG. 18) generated from the pixel circuit layer PCL or the like to the outside.

According to one or more embodiments, the sub-pixel SPXL may include the first contact member CNT1 and the second contact member CNT2. The first contact member CNT1 and the second contact member CNT2 may pass through the second interlayer insulating layer ILD2 and the via layer VIA. The first alignment electrode ALE_S1 and the first transistor electrode TE1 may be electrically connected to each other through the first contact member CNT1. The second alignment electrode ALE_S2 and the power source line PL may be electrically connected to each other through the second contact member CNT2.

The display element layer DPL may be disposed on the pixel circuit layer PCL. The display element layer DPL may include a first insulating layer INS1, an insulating pattern INP, the electrodes ALE, the bank BNK, the light emitting element LD, a second insulating layer INS2, the anode connection electrode ELTA, the cathode connection electrode ELTC, a third insulating layer INS3, and a fourth insulating layer INS4.

The insulating pattern INP may be disposed on the via layer VIA. The insulating pattern INP may have various shapes according to embodiments. In one or more embodiments, the insulating pattern INP may protrude in the thickness direction of the base layer BSL (for example, the third direction DR3). Also, the insulating pattern INP may be formed to have an inclined surface inclined at an angle (e.g., a predetermined or selectable angle) with respect to the base layer BSL. However, the disclosure is not limited thereto, and the insulating pattern INP may have a sidewall having a curved surface or a stepped shape. For example, the insulating pattern INP may have a cross-section having a semi-circular or semi-elliptical shape.

The insulating pattern INP may form a predetermined or selected step difference so that the light emitting elements LD can be easily aligned in the emission area EMA. According to one or more embodiments, the insulating pattern INP may be referred to as a barrier wall.

According to one or more embodiments, portions of the electrodes ALE may be disposed on the insulating pattern INP. For example, the insulating pattern INP may include a first insulating pattern INP1 and a second insulating pattern INP2. The first alignment electrode ALE_S1 may be disposed on the first insulating pattern INP1, and the second alignment electrode ALE_S2 may be disposed on the second insulating pattern INP2. Accordingly, a reflective wall may be formed on the insulating pattern INP. Accordingly, light emitted from the light emitting element LD may be recycled to improve light output efficiency of the display device DD (or the pixel PXL).

The insulating pattern INP may include an organic material. For example, the insulating pattern INP may include an organic material such as an acrylates resin, an epoxy resin, a phenolic resin, a polyamides resin, a polyimides resin, a polyesters resin, a polyphenylenesulfides resin, or benzocyclobutene (BCB). The insulating pattern INP may include an organic material and may function as a path for discharging the gas G generated from the pixel circuit layer PCL or the like to the outside.

The electrodes ALE may be disposed on the via layer VIA and/or the insulating pattern INP. As described above, portions of the electrodes ALE may be disposed on the insulating pattern INP to form reflective walls. The alignment signal (for example, the AC signal and the ground signal) for aligning the light emitting element LD may be supplied to the electrodes ALE. According to one or more embodiments, the electrical signal (for example, the anode signal and the cathode signal) may be supplied to the electrodes ALE so that the light emitting element LD emits light.

According to one or more embodiments, the first insulating layer INS1 may include a first element insulating layer INS1_L disposed adjacent to the light emitting element LD. For example, the first insulating layer INS1 may include the first element insulating layer INS1_L including a region disposed on a rear surface of the light emitting element LD and a first opening-forming insulating layer INS1_O (refer to FIG. 11). Details of the first opening-forming insulating layer INS1_O will be described below with reference to the drawings after FIG. 9.

According to one or more embodiments, the electrodes ALE may be disposed on a rear surface of the first insulating layer INS1. For example, the electrodes ALE may be disposed between the insulating pattern INP or the via layer VIA and the first element insulating layer INS1_L. For example, surfaces of the electrodes ALE may contact the first element insulating layer INS1_L.

The first alignment electrode ALE_S1 may be electrically connected to the light emitting element LD. The first alignment electrode ALE_S1 may be electrically connected to the anode connection electrode ELTA through a contact hole formed in the first insulating layer INS1. The first alignment electrode ALE_S1 may provide the anode signal so that the light emitting element LD emits light.

The second alignment electrode ALE_S2 may be electrically connected to the light emitting element LD. The second alignment electrode ALE_S2 may be electrically connected to the cathode connection electrode ELTC through a contact hole formed in the first element insulating layer INS1_L. The second alignment electrode ALE_S2 may provide the cathode signal (for example, the ground signal) so that the light emitting element LD emits light.

The first insulating layer INS1 may be disposed on the electrodes ALE. For example, the first element insulating layer INS1_L may cover the first alignment electrode ALE_S1 and the second alignment electrode ALE_S2.

The bank BNK may be disposed on the first insulating layer INS1. According to one or more embodiments, the bank BNK may include the first bank BNK1 and the second bank BNK2.

The first bank BNK1 may be disposed on the first insulating layer INS1. According to one or more embodiments, the first bank BNK1 may not overlap the emission area EMA and may overlap the non-emission area NEA in a plan view. As described above, the first bank BNK1 may protrude in the thickness direction of the base layer BSL (for example, the third direction DR3), and the first bank BNK1 may define the bank opening OPN. In a process of supplying the light emitting elements LD, a space in which the light emitting elements LD are provided may be formed in the bank opening OPN.

The first bank BNK1 may include an organic material. For example, the first bank BNK1 may include an organic material such as an acrylates resin, an epoxy resin, a phenolic resin, a polyamides resin, a polyimides resin, a polyesters resin, a polyphenylenesulfides resin, or benzocyclobutene (BCB). According to one or more embodiments, the first bank BNK1 may include an organic material and may function as a path for discharging the gas G generated from the pixel circuit layer PCL or the like to the outside.

The second bank BNK2 may be disposed on the first bank BNK1. The second bank BNK2 may protrude in the thickness direction (for example, the third direction DR3) of the base layer BSL, and the second bank BNK2 may define the bank opening OPN. A space in which the color conversion layer CCL is provided may be formed in the bank opening OPN.

The second bank BNK2 may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto. The second bank BNK2 may include various types of inorganic materials such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The light emitting element LD may be disposed on the first insulating layer INS1. According to one or more embodiments, the light emitting element LD may emit light based on electrical signals (for example, the anode signal and the cathode signal) provided from the anode connection electrode ELTA and the cathode connection electrode ELTC.

The light emitting element LD may be disposed in the region surrounded by the first bank BNK1. The light emitting element LD may be disposed between the first insulating pattern INP1 and the second insulating pattern INP2.

According to one or more embodiments, the second insulating layer INS2 may include a second element insulating layer INS2_L including a region disposed adjacent to the light emitting element LD. For example, the second insulating layer INS2 may include the second element insulating layer INS2_L disposed on the light emitting element LD and a second opening-forming insulating layer INS2_O (refer to FIG. 11). Details of the second opening-forming insulating layer INS2_O will be described below with reference to the drawings after FIGS. 9.

The second element insulating layer INS2_L may be disposed on the light emitting element LD. The second element insulating layer INS2_L may cover the active layer AL of the light emitting element LD.

The second element insulating layer INS2_L may expose at least a portion of the light emitting element LD. For example, the second element insulating layer INS2_L may not cover the first end EP1 and the second end EP2 of the light emitting element LD. Accordingly, the first end EP1 and the second end EP2 of the light emitting element LD may be exposed, and may be electrically connected to the anode connection electrode ELTA and the cathode connection electrode ELTC, respectively.

In case that the second element insulating layer INS2_L is formed on the light emitting elements LD after the light emitting elements LD are aligned, it is possible to prevent the light emitting elements LD from being separated from the aligned positions.

The second insulating layer INS2 may have a single-layer or multi-layer structure. The second insulating layer INS2 may include various types of inorganic materials such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx). However, the disclosure is not limited to the above-described examples.

The anode connection electrode ELTA and the cathode connection electrode ELTC may be disposed on the first insulating layer INS1. The anode connection electrode ELTA may be electrically connected to the first end EP1 of the light emitting element LD. The cathode connection electrode ELTC may be electrically connected to the second end EP2 of the light emitting element LD.

The anode connection electrode ELTA may be electrically connected to the first alignment electrode ALE_S1 through a contact hole penetrating the first insulating layer INS1. The cathode connection electrode ELTC may be electrically connected to the second alignment electrode ALE_S2 through a contact hole penetrating the first insulating layer INS1.

The anode connection electrode ELTA and the cathode connection electrode ELTC may include a conductive material. For example, the anode connection electrode ELTA and the cathode connection electrode ELTC may include a transparent conductive material including at least one of indium tin oxide (ITO), indium zinc oxide (IZO), and indium tin zinc oxide (ITZO). Accordingly, light emitted from the light emitting elements LD may pass through the connection electrodes ELT to be emitted to outside of the display device DD. However, the disclosure is not limited to the above-described examples.

According to one or more embodiments, after any one of the anode connection electrode ELTA and the cathode connection electrode ELTC is patterned, the other electrode may be patterned. However, the disclosure is not limited to the above-described examples. The anode connection electrode ELTA and the cathode connection electrode ELTC may be patterned at the same time in a same process.

According to one or more embodiments, the third insulating layer INS3 may include a third element insulating layer INS3_L including a region disposed adjacent to the light emitting element LD. For example, the third insulating layer INS3 may include the third element insulating layer INS3_L disposed between the anode connection electrode ELTA and the cathode connection electrode ELTC and a third opening-forming insulating layer INS3_O (refer to FIG. 11). Details of the third opening-forming insulating layer INS3_O will be described below with reference to the drawings after FIG. 9.

The third element insulating layer INS3_L may be disposed between the anode connection electrode ELTA and the cathode connection electrode ELTC to prevent a short circuit defect between two electrodes. For example, the third element insulating layer INS3_L may cover the anode connection electrode ELTA to electrically separate the anode connection electrode ELTA and the cathode connection electrode ELTC.

The fourth insulating layer INS4 may be disposed on the third element insulating layer INS2_3 and the connection electrodes ELT. The fourth insulating layer INS4 may protect components of the display element layer DPL from external influences.

The third insulating layer INS3 and the fourth insulating layer INS4 may have a single-layer or multi-layer structure. The fourth insulating layer INS4 may include various types of inorganic materials such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The components of the pixel PXL including the color conversion layer CCL will be described with reference to FIGS. 7 and 8. FIG. 7 illustrates the color conversion layer CCL, the optical layer OPL, the color filter layer CFL, and the like. For convenience of description, components other than the second bank BNK2 among the pixel circuit layer PCL and the display element layer DPL among the above-described components are omitted in FIG. 7. FIG. 8 may illustrate a stacked structure of the pixel PXL in relation to the color conversion layer CCL, the optical layer OPL, and the color filter layer CFL.

Figure 7:
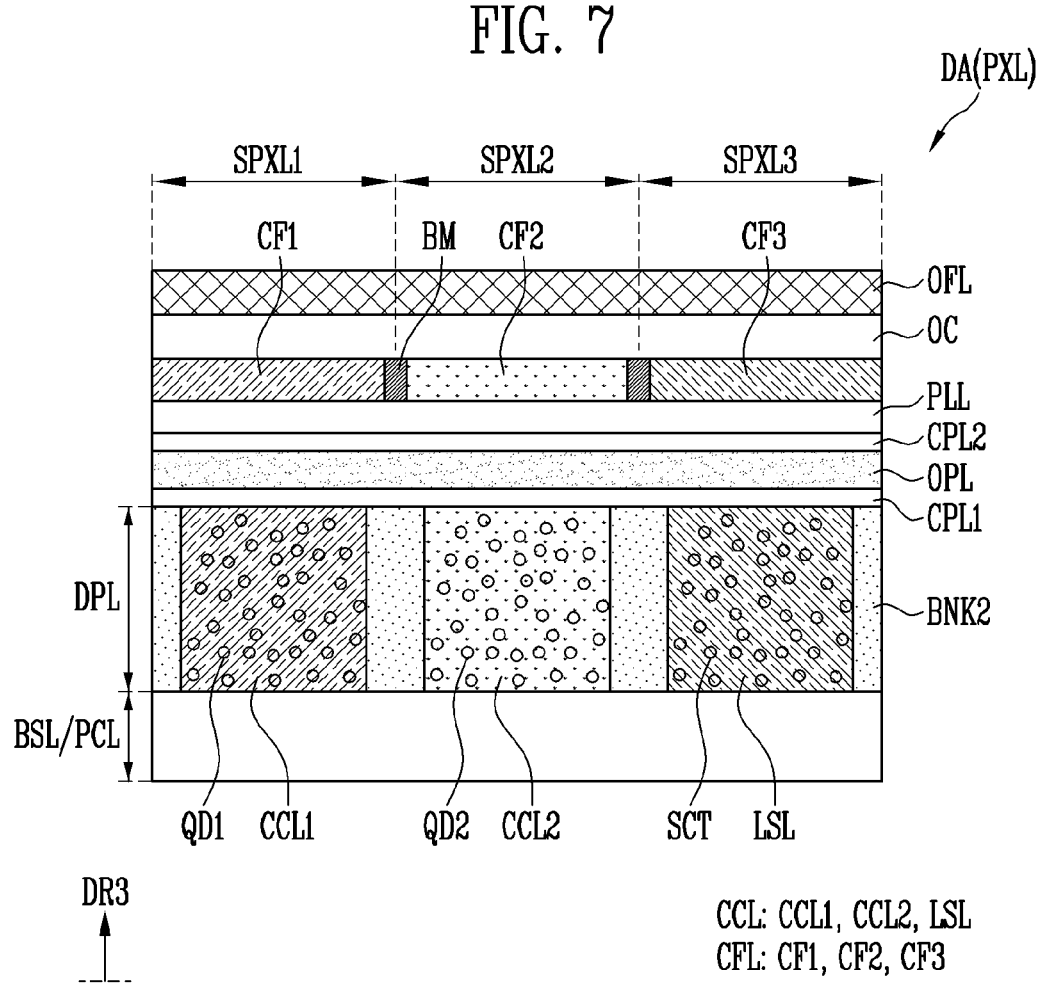
FIG. 7 is a cross-sectional view schematically illustrating a pixel according to one or more embodiments.
Figure 8:
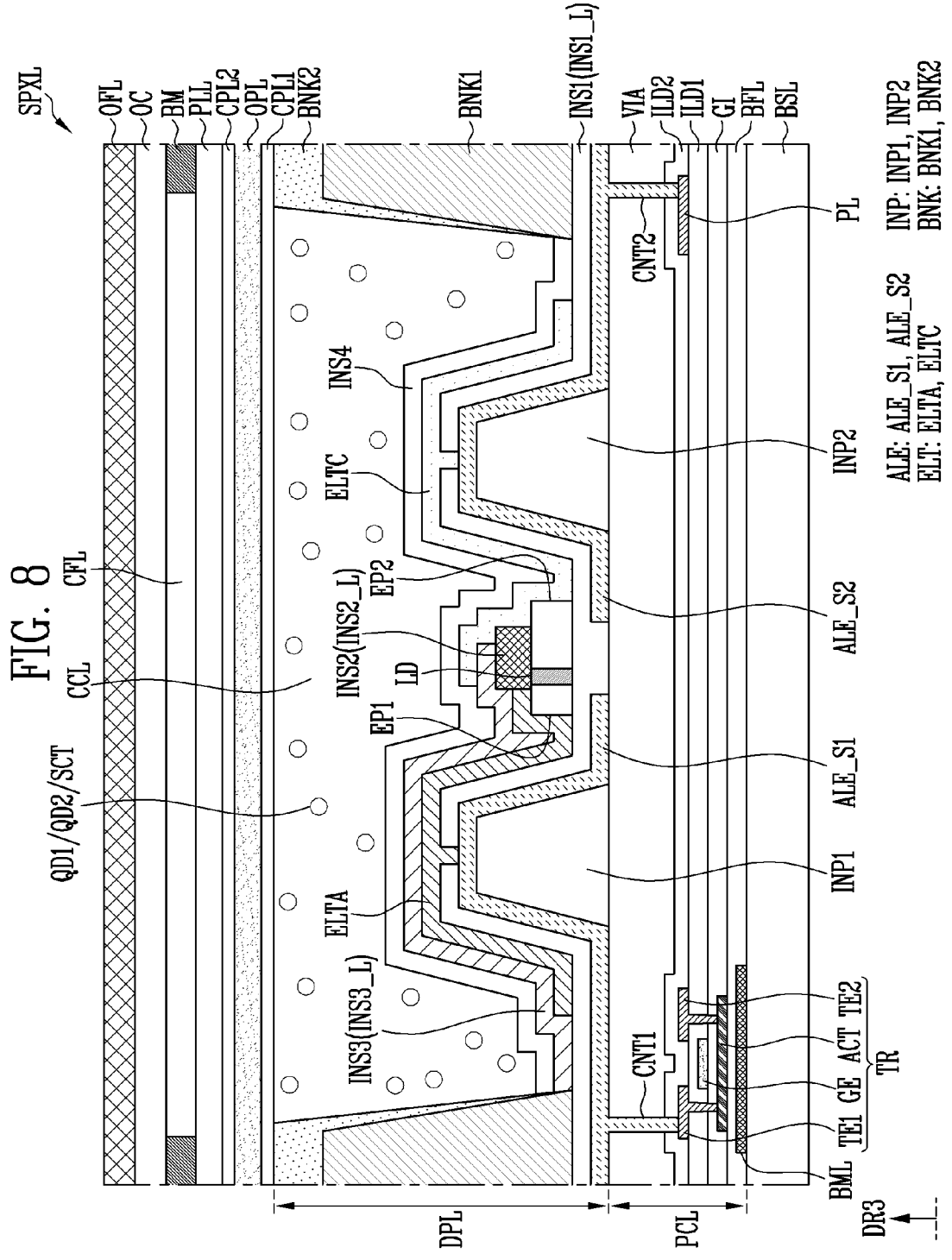
FIG. 8 is a cross-sectional view schematically illustrating a sub-pixel according to one or more embodiments.

Referring to FIGS. 7 and 8, the second bank BNK2 may be disposed between or at a boundary between the first to third sub-pixels SPXL1, SPXL2, and SPXL3, and may define spaces (regions) overlapping the first to third sub-pixels SPXL1, SPXL2, and SPXL3, respectively. The spaces defined by the second bank BNK2 may be regions in which the color conversion layer CCL may be provided.

The color conversion layer CCL may be disposed on the light emitting elements LD in a space surrounded by the second bank BNK2. The color conversion layer CCL may include a first color conversion layer CCL1 disposed on the first sub-pixel SPXL1, a second color conversion layer CCL2 disposed on the second sub-pixel SPXL2, and a scattering layer LSL disposed on the third sub-pixel SPXL3.

The color conversion layer CCL may be disposed on the light emitting element LD. The color conversion layer CCL may be configured to change the wavelength of light. In one or more embodiments, the first to third sub-pixels SPXL1, SPXL2, and SPXL3 may include light emitting elements LD emitting light of a same color. For example, the first to third sub-pixels SPXL1, SPXL2, and SPXL3 may include light emitting elements LD emitting light of the third color (or blue). A full-color image may be displayed by disposing the color conversion layer CCL including color conversion particles on each of the first to third sub-pixels SPXL1, SPXL2, and SPXL3.

The first color conversion layer CCL1 may include first color conversion particles that convert light of the third color emitted from the light emitting element LD into light of the first color. For example, the first color conversion layer CCL1 may include first quantum dots QD1 dispersed in a matrix material (e.g., a predetermined or selectable matrix material) such as a base resin.

In one or more embodiments, in case that the light emitting element LD is a blue light emitting element emitting blue light and the first sub-pixel SPXL1 is a red pixel, the first color conversion layer CCL1 may include the first quantum dots QD1 that convert blue light emitted from the blue light emitting element into red light. The first quantum dots QD1 may absorb blue light and shift the wavelength according to energy transition to emit red light. In case that the first sub-pixel SPXL1 is a pixel of a different color, the first color conversion layer CCL1 may include the first quantum dots QD1 corresponding to the color of the first sub-pixel SPXL1.

The second color conversion layer CCL2 may include second color conversion particles that convert light of the third color emitted from the light emitting element LD into light of the second color. For example, the second color conversion layer CCL2 may include second quantum dots QD2 dispersed in a matrix material (e.g., a predetermined or selectable matrix material) such as a base resin.

In one or more embodiments, in case that the light emitting element LD is a blue light emitting element emitting blue light and the second sub-pixel SPXL2 is a green pixel, the second color conversion layer CCL2 may include the second quantum dots QD2 that convert blue light emitted from the blue light emitting element into green light. The second quantum dots QD2 may absorb blue light and shift the wavelength according to energy transition to emit green light. In case that the second sub-pixel SPXL2 is a pixel of a different color, the second color conversion layer CCL2 may include the second quantum dots QD2 corresponding to the color of the second sub-pixel SPXL2.

In one or more embodiments, since blue light having a relatively short wavelength in the visible light region is incident on the first quantum dots QD1 and the second quantum dots QD2, respectively, absorption coefficients of the first quantum dots QD1 and the second quantum dots QD2 may be increased. Accordingly, the efficiency of light finally emitted from the first sub-pixel SPXL1 and the second sub-pixel SPXL2 may be improved, and excellent color reproducibility may be secured. The manufacturing efficiency of the display device DD may be improved by configuring the emission part EMU of the first to third sub-pixels SPXL1, SPXL2, and SPXL3 using light emitting elements LD of a same color (for example, blue light emitting elements).

The scattering layer LSL may be provided to efficiently use the light of the third color (or blue) emitted from the light emitting element LD. For example, in case that the light emitting element LD is a blue light emitting element emitting blue light and the third sub-pixel SPXL3 is a blue pixel, the scattering layer LSL may include at least one type of scatterers SCT in order to efficiently use the light emitted from the light emitting element LD. For example, the scatterers SCT of the scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). The scatterers SCT are not disposed only in the third sub-pixel SPXL3, and may also be selectively included in the first color conversion layer CCL1 or the second color conversion layer CCL2. According to one or more embodiments, the scatterers SCT may be omitted and the scattering layer LSL made of a transparent polymer may be provided.

A first capping layer CPL1 may be disposed on the color conversion layer CCL. The first capping layer CPL1 may be provided over the first to third sub-pixels SPXL1, SPXL2, and SPXL3. The first capping layer CPL1 may cover the color conversion layer CCL. The first capping layer CPL1 may prevent impurities such as moisture or air from penetrating from the outside to damage or contaminate the color conversion layer CCL.

The first capping layer CPL1 may be an inorganic layer, and may include silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), silicon oxynitride (SiOxNy), or the like.

The optical layer OPL may be disposed on the first capping layer CPL1. The optical layer OPL may serve to improve light extraction efficiency by recycling light provided from the color conversion layer CCL by total reflection. To this end, the optical layer OPL may have the refractive index relatively lower than that of the color conversion layer CCL. For example, the refractive index of the color conversion layer CCL may be about 1.6 to about 2.0, and the refractive index of the optical layer OPL may be about 1.1 to about 1.3.

A second capping layer CPL2 may be disposed on the optical layer OPL. The second capping layer CPL2 may be provided over the first to third sub-pixels SPXL1, SPXL2, and SPXL3. The second capping layer CPL2 may cover the optical layer OPL. The second capping layer CPL2 may prevent impurities such as moisture or air from penetrating from the outside to damage or contaminate the optical layer OPL.

The second capping layer CPL2 may be an inorganic layer, and may include silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), silicon oxynitride (SiOxNy), or the like.

A planarization layer PLL may be disposed on the second capping layer CPL2. The planarization layer PLL may be provided over the first to third sub-pixels SPXL1, SPXL2, and SPXL3.

The planarization layer PLL may include an organic material such as an acrylic resin, an epoxy resin, a phenolic resin, a polyamide resin, a polyimide resin, a polyester resin, a polyphenylenesulfide resin, or benzocyclobutene (BCB). However, the disclosure is not limited thereto. The planarization layer PLL may include various types of inorganic materials such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The color filter layer CFL may be disposed on the planarization layer PLL. The color filter layer CFL may include color filters CF1, CF2, and CF3 matching the color of each pixel PXL. A full-color image may be displayed by disposing the color filters CF1, CF2, and CF3 matching the colors of the first to third sub-pixels SPXL1, SPXL2, and SPXL3, respectively.

The color filter layer CFL may include a first color filter CF1 disposed on the first sub-pixel SPXL1 to selectively transmit light emitted from the first sub-pixel SPXL1, a second color filter CF2 disposed on the second sub-pixel SPXL2 to selectively transmit light emitted from the second sub-pixel SPXL2, and a third color filter CF3 disposed on the third sub-pixel SPXL3 to selectively transmit light emitted from the third sub-pixel SPXL3.

In one or more embodiments, the first color filter CF1, the second color filter CF2, and the third color filter CF3 may be a red color filter, a green color filter, and a blue color filter, respectively. However, the disclosure is not limited thereto. Hereinafter, when referring to any color filter among the first color filter CF1, the second color filter CF2, and the third color filter CF3, or generically referring to two or more types of color filters, they will be referred to as "color filter CF" or "color filters CF".

The first color filter CF1 may overlap the first color conversion layer CCL1 in a thickness direction (for example, the third direction DR3) of the substrate SUB. The first color filter CF1 may include a color filter material that selectively transmits light of the first color (or red). For example, in case that the first sub-pixel SPXL1 is a red pixel, the first color filter CF1 may include a red color filter material.

The second color filter CF2 may overlap the second color conversion layer CCL2 in the thickness direction (for example, the third direction DR3) of the substrate SUB. The second color filter CF2 may include a color filter material that selectively transmits light of the second color (or green). For example, in case that the second sub-pixel SPXL2 is a green pixel, the second color filter CF2 may include a green color filter material.

The third color filter CF3 may overlap the scattering layer LSL in the thickness direction (for example, the third direction DR3) of the substrate SUB. The third color filter CF3 may include a color filter material that selectively transmits light of the third color (or blue). For example, in case that the third sub-pixel SPXL3 is a blue pixel, the third color filter CF3 may include a blue color filter material.

According to one or more embodiments, a light blocking layer BM may be further disposed between the first to third color filters CF1, CF2, and CF3. As such, in case that the light blocking layer BM is formed between the first to third color filters CF1, CF2, and CF3, color mixing defects visually recognized from the front or side of the display device DD can be prevented. The material of the light blocking layer BM is not particularly limited, and the light blocking layer BM may be composed of various light blocking materials. For example, the light blocking layer BM may include a black matrix or may be implemented by stacking the first to third color filters CF1, CF2, and CF3 on each other.

An overcoat layer OC may be disposed on the color filter layer CFL. The overcoat layer OC may be provided over the first to third sub-pixels SPXL1, SPXL2, and SPXL3. The overcoat layer OC may cover a lower member including the color filter layer CFL. The overcoat layer OC may prevent moisture or air from penetrating into the above-described lower member. The overcoat layer OC may protect the above-described lower member from foreign substances such as dust.

The overcoat layer OC may include an organic material such as an acrylic resin, an epoxy resin, a phenolic resin, a polyamide resin, a polyimide resin, a polyester resin, a polyphenylenesulfide resin, or benzocyclobutene (BCB). However, the disclosure is not limited thereto. The overcoat layer OC may include various types of inorganic materials such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The outer film layer OFL may be disposed on the overcoat layer OC. The outer film layer OFL may be disposed outside the display device DD to reduce external influences. The outer film layer OFL may be provided over the first to third sub-pixels SPXL1, SPXL2, and SPXL3. According to one or more embodiments, the outer film layer OFL may include at least one of a polyethyleneterephthalate (PET) film, a low reflection film, a polarizing film, and a transmittance controllable film, but the disclosure is not limited thereto.

According to one or more embodiments, the pixel PXL may include an upper substrate instead of the outer film layer OFL.

A structure of the pixel PXL (or sub-pixel SPXL) according to one or more embodiments for forming an outgassing path will be described with reference to FIGS. 9 to 17. Contents that may be repetitive with respect to the above-described contents will be briefly described or will not be repeatedly described.

Figure 9:
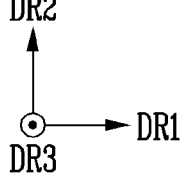
FIGS. 9 and 10 are plan views schematically illustrating a planar structure of a pixel according to a first embodiment.
Figure 10:
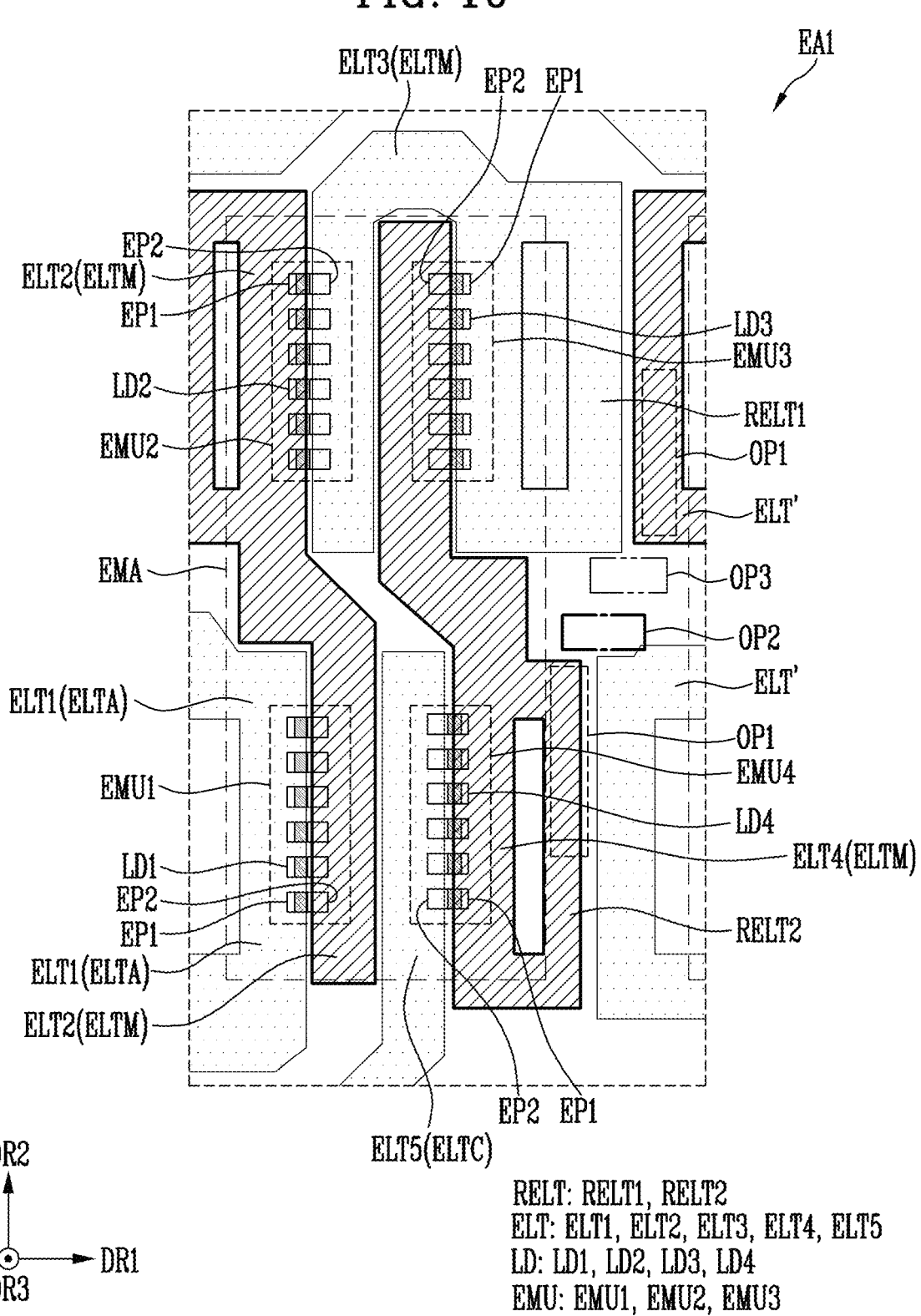
Figure 11:
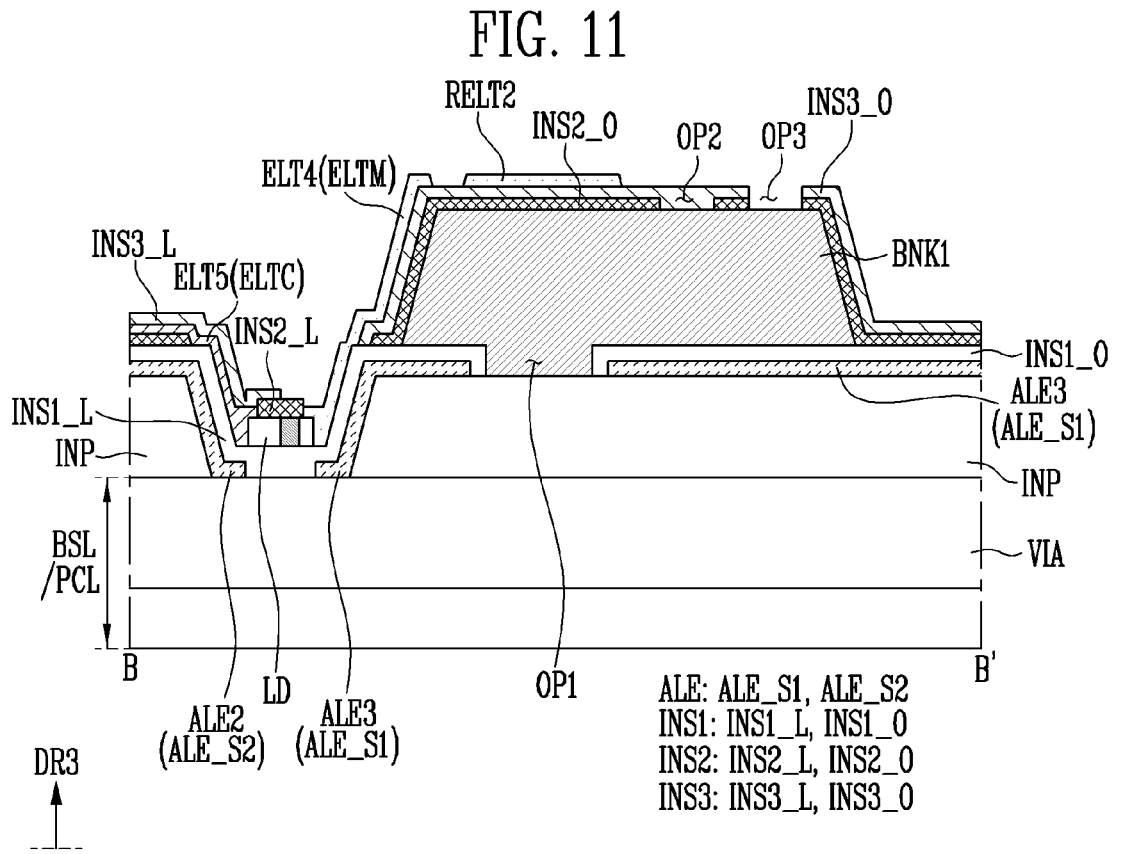
FIG. 11 is a plan view schematically illustrating a cross-sectional structure of the pixel according to the first embodiment.
Figure 12:
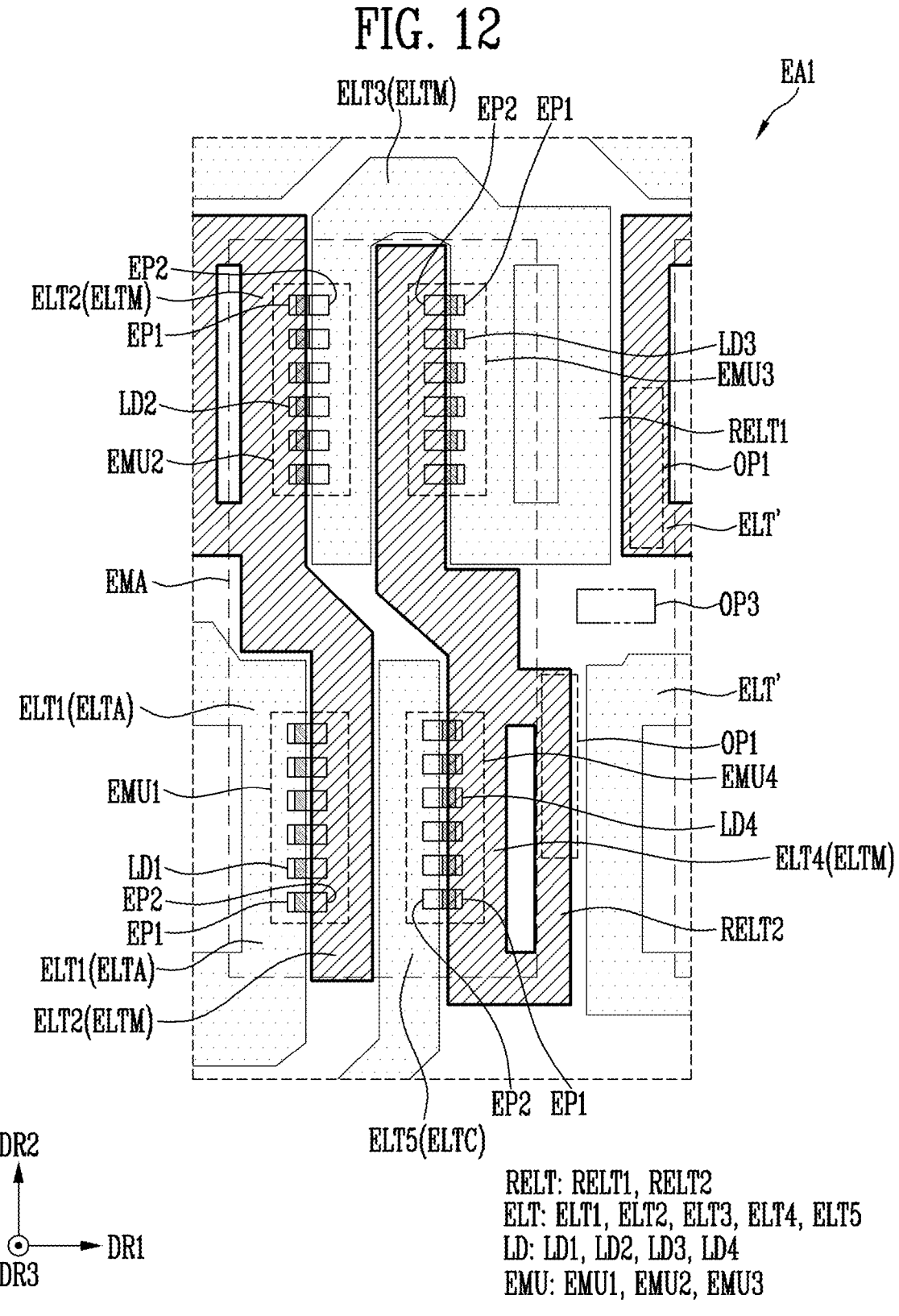
FIG. 12 is a plan view schematically illustrating a planar structure of a pixel according to a second embodiment.
Figure 13:
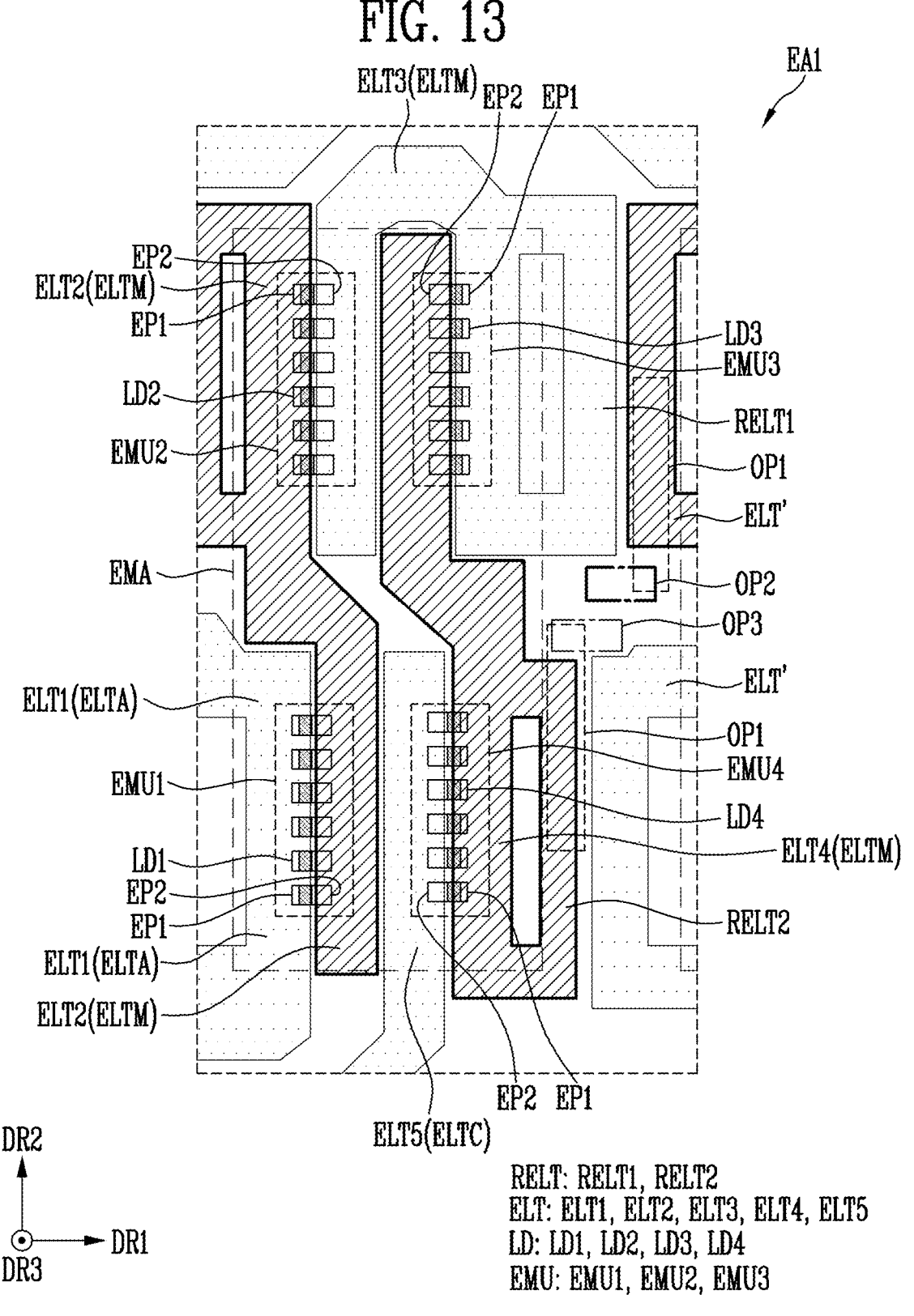
FIG. 13 is a plan view schematically illustrating a planar structure of a pixel according to a third embodiment.
Figure 14:
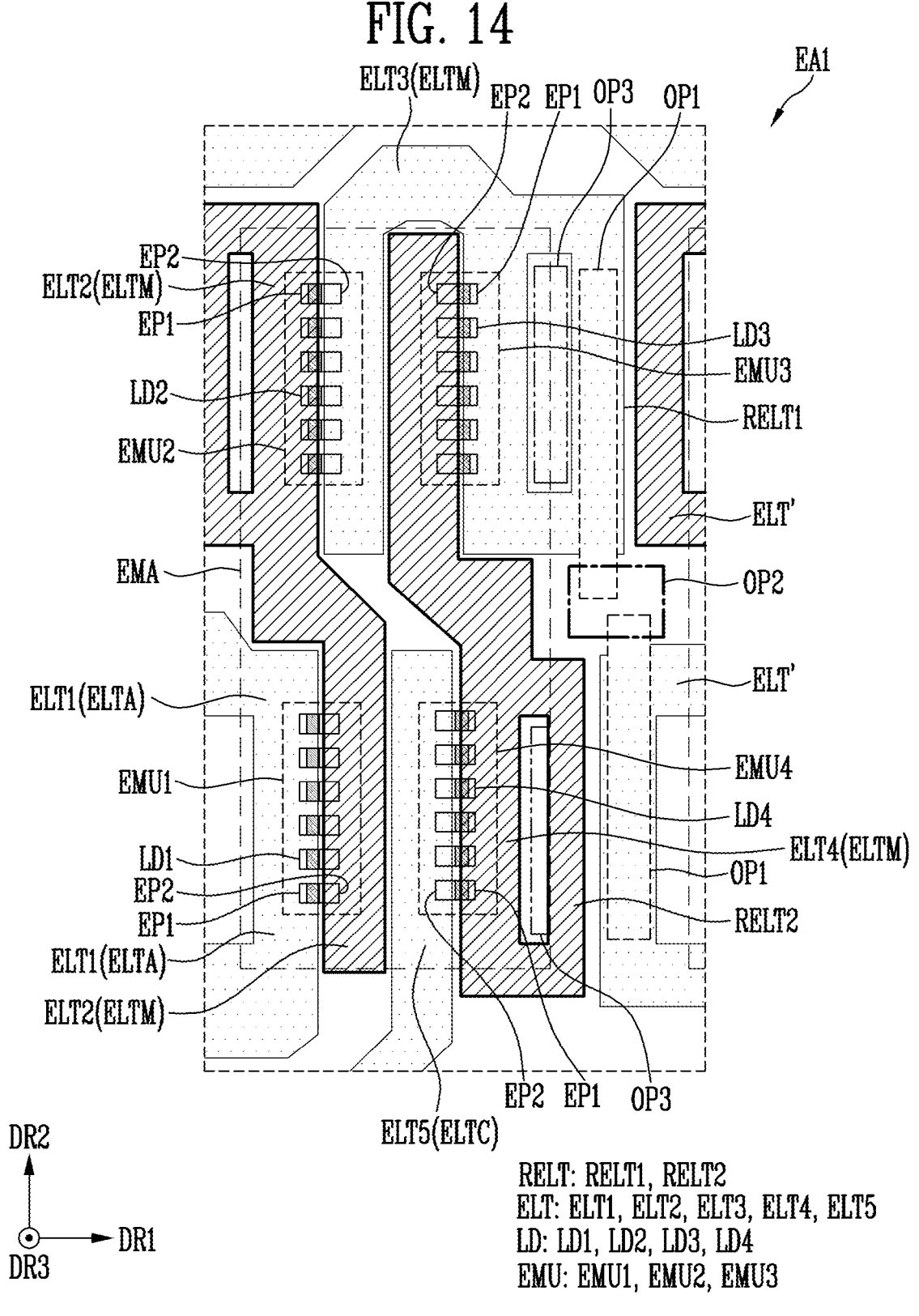
FIG. 14 is a plan view schematically illustrating a planar structure of a pixel according to a fourth embodiment.
Figure 15:
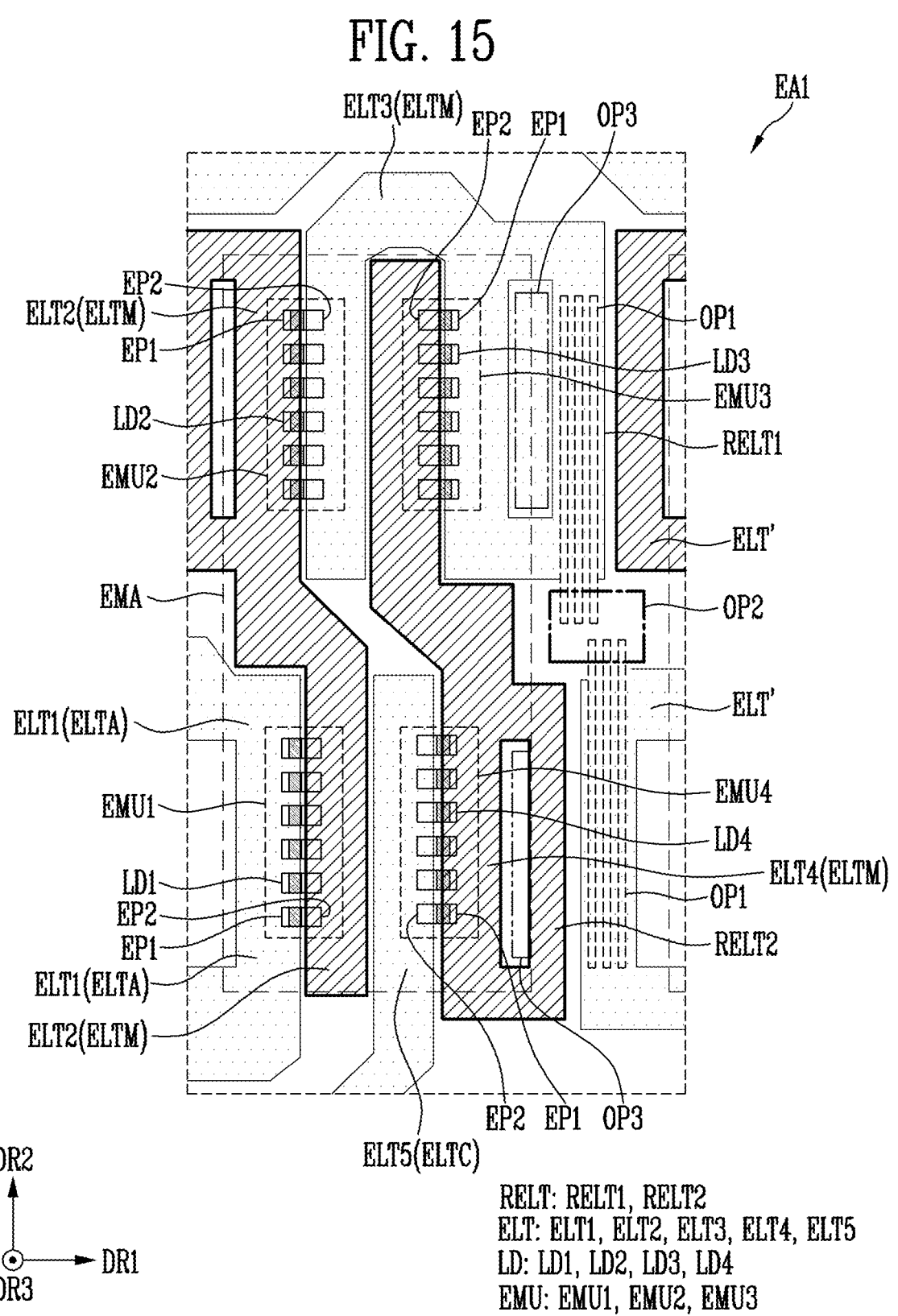
FIG. 15 is a plan view schematically illustrating a planar structure of a pixel according to a fifth embodiment.
Figure 16:
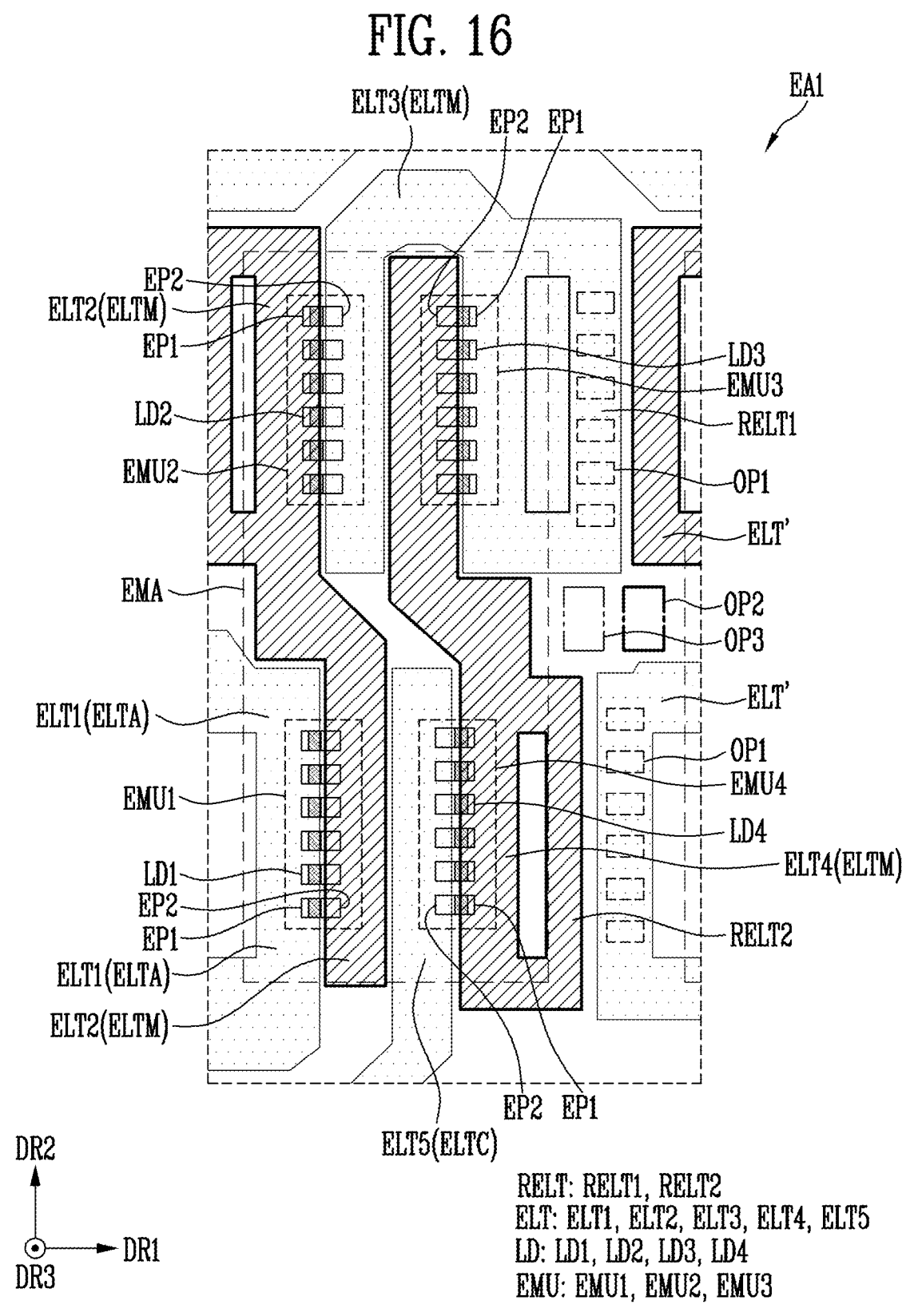
Figure 17:
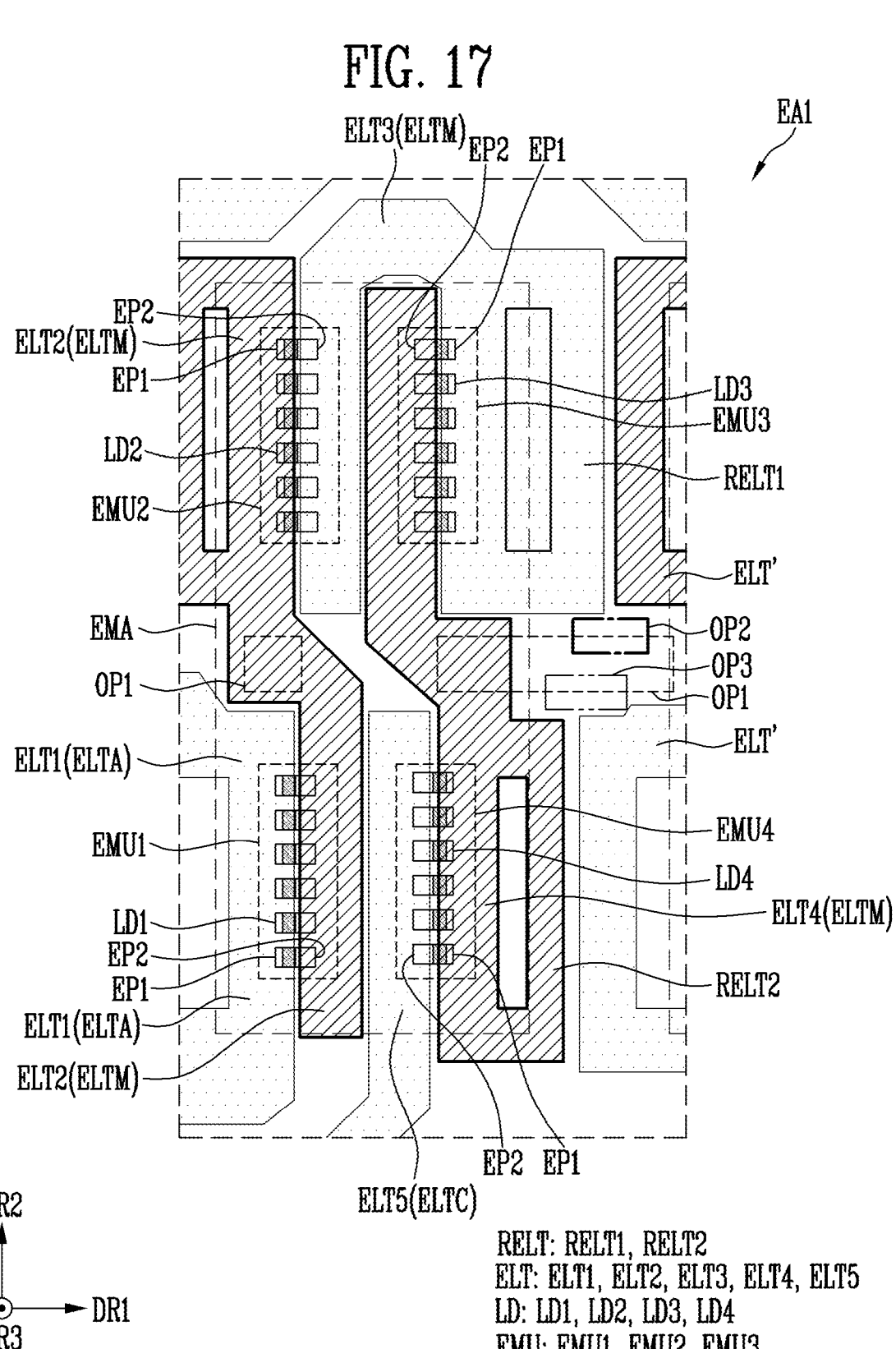
FIG. 17 is a plan view schematically illustrating a planar structure of a pixel according to a seventh embodiment.

FIGS. 9, 10, and 12 to 17 may be enlarged views schematically illustrating area EA1 of FIG. 4. FIGS. 9 and 10 are plan views schematically illustrating a planar structure of a pixel PXL according to a first embodiment. FIG. 11 is a plan view schematically illustrating a cross-sectional structure of the pixel PXL according to the first embodiment. FIG. 12 is a plan view schematically illustrating a planar structure of a pixel PXL according to a second embodiment. FIG. 13 is a plan view schematically illustrating a planar structure of a pixel PXL according to a third embodiment. FIG. 14 is a plan view schematically illustrating a planar structure of a pixel PXL according to a fourth embodiment. FIG. 15 is a plan view schematically illustrating a planar structure of a pixel PXL according to a fifth embodiment. FIG. 16 is a plan view schematically illustrating a planar structure of a pixel PXL according to a sixth embodiment. FIG. 17 is a plan view schematically illustrating a planar structure of a pixel PXL according to a seventh embodiment.

First, a structure of the pixel PXL according to the first embodiment for securing the outgassing path will be described with reference to FIGS. 9 to 11. FIGS. 9 and 10 are schematic plan views illustrating a same area (for example, area EA1 of FIG. 4). Some components are shown in FIGS. 9 and 10. However, some components that can be disposed in area EA1 are shown only in FIG. 9 so that the components can be clearly recognized, and other components that can be disposed in area EA1 are only shown in FIG. 10. The positional relationship of the components of the pixel PXL will be clearly understood with reference to FIGS. 9 to 10. FIG. 11 is a schematic cross-sectional view taken along line B-B' of FIG. 9.

According to one or more embodiments, the emission part EMU may include first to fourth emission parts EMU1 to EMU4. For example, first light emitting elements LD1 of the first emission part EMU1, second light emitting elements LD2 of the second emission part EMU2, third light emitting elements LD3 of the third emission part EMU3, and fourth light emitting elements LD4 of the fourth emission part EMU4 may be connected in series. According to one or more embodiments, the connection electrodes ELT may include first to fifth connection electrodes ELT1 to ELT5.

For example, the first ends EP1 of the first light emitting elements LD1 may be electrically connected to the first connection electrode ELT1 that is the anode connection electrode ELTA, and the second ends EP2 of the first light emitting elements LD1 may be electrically connected to the second connection electrode ELT2 serving as an intermediate connection electrode ELTM among the connection electrodes ELT. The first ends EP1 of the second light emitting elements LD2 may be electrically connected to the second connection electrode ELT2 serving as the intermediate connection electrode ELTM among the connecting electrodes ELT, and the second ends EP2 of the second light emitting elements LD2 may be electrically connected to the third connection electrode ELT3 serving as the intermediate connection electrode ELTM among the connection electrodes ELT. The first ends EP1 of the third light emitting elements LD3 may be electrically connected to the third connection electrode ELT3 serving as the intermediate connection electrode ELTM among the connection electrodes ELT, and the second ends EP2 of the third light emitting elements LD3 may be electrically connected to the fourth connection electrode ELT4 serving as the intermediate connection electrode ELTM among the connection electrodes ELT. The first ends EP1 of the fourth light emitting elements LD4 may be electrically connected to the fourth connection electrode ELT4 serving as the intermediate connection electrode ELTM among the connection electrodes ELT, and the second ends EP2 of the fourth light emitting elements LD4 may be electrically connected to the fifth connection electrode ELT5 that is the cathode connection electrode ELTC.

According to one or more embodiments, the first light emitting elements LD1 of the first emission part EMU1 and the second light emitting elements LD2 of the second emission part EMU2 may be aligned between a first electrode ALE1 that is the first alignment electrode ALE_S1 and a second electrode ALE2 that is the second alignment electrode ALE_S2. The third light emitting elements LD3 of the third emission part EMU3 and the fourth light emitting elements LD4 of the fourth emission part EMU4 may be aligned between a third electrode ALE3 that is the first alignment electrode ALE_S1 and the second electrode ALE2 that is the second alignment electrode ALE_S2. For convenience of description, lines representing the electrodes ALE are shown to be thicker than lines representing insulating patterns INP in FIG. 9.

According to one or more embodiments, each of the connection electrodes ELT may include extension connection electrodes RELT. For example, some of the connection electrodes ELT (for example, the third connection electrode ELT3) may be integrally formed with a first extension connection electrode RELT1. Some of the connection electrodes ELT (for example, the fourth connection electrode ELT4) may be integrally formed with a second extension connection electrode RELT2. According to one or more embodiments, the extension connection electrodes RELT may not directly contact the light emitting elements LD. According to one or more embodiments, the extension connection electrodes RELT may be disposed on the first bank BNK1. According to one or more embodiments, the extension connection electrodes RELT may be portions of the connection electrodes ELT, and may mean electrodes overlapping the first bank BNK1 (or electrodes including a region overlapping the first bank BNK1) in a plan view. For example, the portions of the connection electrodes ELT may be patterned even in a region somewhat spaced apart from the light emitting elements LD to provide the extension connection electrodes RELT. A risk that the connection electrodes ELT may be disconnected can be substantially prevented.

According to one or more embodiments, each of the extension connection electrodes RELT may be physically spaced apart from the light emitting elements LD. According to one or more embodiments, portions of the extension connection electrodes RELT and other connection electrodes ELT may be disposed to surround at least a partial region.

According to one or more embodiments, the extension connection electrodes RELT may be adjacent to adjacent connection electrodes ELT' of other adjacent sub-pixel SPXL. The adjacent connection electrodes ELT' may form (e.g., directly form) a boundary line with the extension connection electrodes RELT.

According to one or more embodiments, the pixel PXL may include a first opening OP1 formed (or provided) by a first opening-forming insulating layer INS1_O, a second opening OP2 formed (or provided) by a second opening-forming insulating layer INS2_O, and a third opening OP3 formed (or provided) by second and third opening-forming insulating layers INS2_O and INS3_O. According to one or more embodiments, the first to third openings OP1, OP2, and OP3 may function as the outgassing path. For convenience of description, the first opening OP1 is indicated by a dotted line, the second opening OP2 is indicated by a dash-single dotted line, and the third opening OP3 is indicated by a dash-double dotted line.

According to one or more embodiments, the first opening OP1 may be disposed under the extension connection electrodes RELT. The first opening OP1 may overlap the extension connection electrodes RELT in a plan view. For example, the first opening OP1 may be defined on rear surfaces of the extension connection electrodes RELT. According to one or more embodiments, the first opening OP1 may be entirely covered by the extension connection electrodes RELT.

The first opening OP1 may extend under the extension connection electrodes RELT in a direction. For example, the first opening OP1 may extend in the second direction DR2 on a rear surface of the second extension connection electrode RELT2. According to one or more embodiments, in case that the adjacent connection electrode ELT' is the extension connection electrode RELT of the adjacent sub-pixel SPXL, the first opening OP1 may be disposed on a rear surface of the adjacent connection electrode ELT'.

According to one or more embodiments, the first opening OP1 may overlap in a direction (for example, the first direction DR1) from the first ends EP1 to the second ends EP2 of the light emitting elements LD. For example, the first opening OP1 may overlap the emission area EMA (or the emission part EMU) in the first direction DR1. According to one or more embodiments, the first opening OP1 may not overlap the light emitting elements LD in a direction (for example, the second direction DR2) in which the light emitting elements LD are sequentially arranged. For example, the first opening OP1 may not overlap the emission area EMA (or the emission part EMU) in the second direction DR2. Accordingly, the first opening OP1 may be specifically disposed in a region in which electrodes are disposed adjacent to the emission area EMA to define the outgassing path. Even in case that wirings are patterned with a high density, the outgassing path can be sufficiently formed. In particular, a risk of lifting of layers (for example, insulating layers) in the entire pixel PXL can be substantially prevented.

The second and third openings OP2 and OP3 may not be disposed under the extension connection electrodes RELT. The second and third openings OP2 and OP3 may not overlap the extension connection electrodes RELT in a plan view. According to an embodiment, the second and third openings OP2 and OP3 may not overlap the connection electrodes ELT in a plan view.

According to one or more embodiments, the second and third openings OP2 and OP3 may be spaced apart from each other. For example, the second opening OP2 and the third opening OP3 may be spaced apart from each other in the second direction DR2.

According to one or more embodiments, the second and third openings OP2 and OP3 may not be disposed in the emission area EMA. For example, the second and third openings OP2 and OP3 may overlap the first bank BNK1 in a plan view in a region in which the light emitting elements LD are not disposed. The second and third openings OP2 and OP3 may not overlap the emission parts EMU (or the light emitting elements LD) in the first direction DR1. The second and third openings OP2 and OP3 may not overlap the emission parts EMU (or the light emitting elements LD) in the second direction DR2. For example, according to one or more embodiments, the second and third openings OP2 and OP3 may be selectively disposed in a region where the connection electrodes ELT are not disposed, and may define the outgassing path.

According to one or more embodiments, the second and third openings OP2 and OP3 may not overlap the first opening OP1 in a plan view. The second and third openings OP2 and OP3 may be connected to the first opening OP1 through the first bank BNK1. For example, the second and third openings OP2 and OP3 may be directly adjacent to a portion of the first bank BNK1, and another portion of the first bank BNK1 may be disposed in the first opening OP1. For example, the gas G applied to the first opening OP1 may be provided to the second opening OP2 and the third opening OP3 via the first bank BNK1. Accordingly, the gas G generated inside the pixel circuit layer PCL may be discharged to the outside.

The first to third openings OP1 to OP3 may be defined by the first to third opening-forming insulating layers INS1_O to INS3_O.

According to one or more embodiments, the first opening-forming insulating layer INS1_O may form the first opening OP1. For example, the first opening-forming insulating layer INS1_O may be disposed on the electrodes ALE to expose a portion of the insulating pattern INP. The first opening-forming insulating layer INS1_O may not be disposed on a portion of an upper surface of the insulating pattern INP, and thus the first opening OP1 may be provided. According to one or more embodiments, the first opening-forming insulating layer INS1_O adjacent to the first opening OP1 may cover side surfaces of the electrodes ALE.

A portion of the first bank BNK1 may be disposed (or provided) in the first opening OP1. According to one or more embodiments, the first bank BNK1 may be patterned after the first opening OP1 is formed, so that the portion of the first bank BNK1 may be filled into the first opening OP1. According to one or more embodiments, the portion of the first bank BNK1 disposed in the first opening OP1 may contact the insulating pattern INP.

According to one or more embodiments, the second opening-forming insulating layer INS2_O may form the second opening OP2. For example, the second opening-forming insulating layer INS2_O may be disposed on the first bank BNK1 to expose a portion of the first bank BNK1. The second opening-forming insulating layer INS2_O may not be disposed on a portion of the upper surface of the first bank BNK1, and thus the second opening OP2 may be provided.

According to one or more embodiments, the second opening-forming insulating layer INS2_O may expose the first bank BNK1 in a region where the third opening OP3 is to be disposed. Accordingly, in case that the third insulating layer INS3 is patterned, the first bank BNK1 may be exposed in the third opening OP3. However, the disclosure is not limited thereto. For example, the second opening-forming insulating layer INS2_O may not expose the first bank BNK1 in the region where the third opening OP3 is to be formed. In case that the third insulating layer INS3 is patterned to form the third opening OP3, the second opening-forming insulating layer INS2_O and the third opening-forming insulating layer INS3_0 may be simultaneously patterned.

A portion of the third opening-forming insulating layer INS3_O may be disposed (or provided) in the second opening OP2. According to one or more embodiments, the second opening OP2 may expose the first bank BNK1 before the third insulating layer INS3 is patterned. The second opening OP2 may function as the outgassing path before the third insulating layer INS3 is patterned.

According to one or more embodiments, the third opening-forming insulating layer INS3_O may form the third opening OP3. For example, the second opening-forming insulating layer INS2_O and the third opening-forming insulating layer INS3_O may define the third opening OP3. For example, the second opening-forming insulating layer INS2_O and the third opening-forming insulating layer INS3_O may be disposed on the first bank BNK1 to expose a portion of the first bank BNK1. The second opening-forming insulating layer INS2_O and the third opening-forming insulating layer INS3_O may not be disposed on a portion of the upper surface of the first bank BNK1, and thus the third opening OP3 may be provided.

The third opening OP3 may expose the first bank BNK1. Accordingly, the gas G applied through the first bank BNK1 may be discharged through the third opening OP3. For example, the gas G generated in the stacked structure of the pixel PXL such as the pixel circuit layer PCL may be discharged through the outgassing path including the first to third openings OP1 to OP3. For example, the via layer VIA, the insulating pattern INP, and the first bank BNK1 may include an organic material. The gas G generated therein may move through the via layer VIA, the insulating pattern INP, and the first bank BNK1. According to the disclosure, the first opening OP1 through which the gas G is applied from the insulating pattern INP to the first bank BNK1 may be formed, and the second and third openings OP2 and OP3 through which the gas G is discharged from the first bank BNK1 may be formed, so that the outgassing path can be clearly defined. In particular, since the first opening OP1 is disposed under the extension connection electrodes RELT, which are the portions of the connection electrodes ELT, the degree of freedom of a process for determining the outgassing path can be increased and the outgassing path can be easily implemented even under a complicated wiring structure.

A structure of the pixel PXL according to the second embodiment for securing the outgassing path will be described with reference to FIG. 12. FIG. 12 is a plan view schematically illustrating area EA1 of FIG. 4, and illustrates the pixel PXL according to the second embodiment. Contents that may be repetitive with respect to the above-described contents will be briefly described or will not be repeatedly described, and differences from the previous embodiment will be mainly described.

The pixel PXL according to the second embodiment may be different from the pixel PXL according to the first embodiment at least in that the second opening OP2 is not disposed between adjacent first openings OP1 and only the third opening OP3 is disposed.

According to one or more embodiments, the second opening OP2 may not be disposed between first openings OP1. Based on a direction (for example, the second direction DR2) in which the light emitting elements LD are sequentially arranged, the second opening OP2 may not be disposed between the first openings OP1 and only the third opening OP3 may be disposed therebetween. For example, the third opening OP3 disposed between the first openings OP1 may overlap the first opening OP1 in the second direction DR2. The third opening OP3 may not overlap the emission part EMU (for example, the light emitting elements LD) in the first direction DR1.

A structure of the pixel PXL according to the third embodiment for securing the outgassing path will be described with reference to FIG. 13. FIG. 13 is a plan view schematically illustrating area EA1 of FIG. 4, and illustrates the pixel PXL according to the third embodiment. Contents that may be repetitive with respect to the above-described contents will be briefly described or will not be repeatedly described, and differences from the previous embodiments will be mainly described.

The pixel PXL according to the third embodiment may be different from the pixel PXL according to the first embodiment at least in that the first opening OP1 overlaps the second opening OP2 and/or the third opening OP3 in a plan view.

According to one or more embodiments, the first opening OP1 may extend (or expand) to an area in which the second opening OP2 and the third opening OP3 are disposed in the second direction DR2. For example, the first opening OP1 according to the second embodiment may further extend in the direction in which the light emitting elements LD are sequentially arranged, compared to the first opening OP1 according to the first embodiment. A portion of the first opening OP1 may overlap the second opening OP2 or the third opening OP3, while another portion of the first opening OP1 may not overlap the second opening OP2 or the third opening OP3. The outgassing path from the first opening OP1 to the second opening OP2 or the third opening OP3 may be shortened.

A structure of the pixel PXL according to the fourth embodiment for securing the outgassing path will be described with reference to FIG. 14. FIG. 14 is a plan view schematically illustrating area EA1 of FIG. 4, and illustrates the pixel PXL according to the fourth embodiment. Contents that may be repetitive with respect to the above-described contents will be briefly described or will not be repeatedly described, and differences from the previous embodiments will be mainly described.

The pixel PXL according to the fourth embodiment may be different from the pixel PXL according to the first embodiment at least in that the first opening OP1 extends in a direction and overlaps the second opening OP2 in a plan view, and the third opening OP3 is disposed in a region surrounded by the extension connection electrodes RELT and portions of the connection electrodes ELT that electrically contact the light emitting elements LD.

According to one or more embodiments, the first opening OP1 may extend (or expand) in the direction (for example, the second direction DR2) in which the light emitting elements LD are sequentially arranged, and a portion of the first opening OP1 may overlap the second opening OP2 in a plan view. The third opening OP3 may be disposed in a region surrounded by the connection electrodes ELT. For example, the extension connection electrode RELT may be spaced apart from the portions of the connection electrodes ELT physically adjacent to (or contacting) the light emitting elements LD with a region interposed therebetween. The portions of the connection electrodes ELT not disposed on the first bank BNK1 and the extension connection electrode RELT disposed on the first bank BNK1 may be patterned to surround a region. The third opening OP3 may be selectively disposed in the region. In particular, according to one or more embodiments, the third opening OP3 may have a structure defined by the third opening-forming insulating layer INS3_O, and the third opening-forming insulating layer INS3_O may be patterned before some connection electrodes ELT (for example, the fourth connection electrode ELT4 and the second extension connection electrode RELT2). For example, since the third opening OP3 is selectively formed in the region surrounded by the connection electrodes ELT as a region in which the portions of the connection electrodes ELT that are patterned after the third opening-forming insulating layer INS3_O are not disposed, even in case that all of the connection electrodes ELT are patterned, the third opening OP3 may function as the outgassing path.

A structure of the pixel PXL according to the fifth embodiment for securing the outgassing path will be described with reference to FIG. 15. FIG. 15 is a plan view schematically illustrating area EA1 of FIG. 4, and illustrates the pixel PXL according to the fifth embodiment. Contents that may be repetitive with respect to the above-described contents will be briefly described or will not be repeatedly described, and differences from the previous embodiments will be mainly described.

The pixel PXL according to the fifth embodiment may be different from the pixel PXL according to the fourth embodiment at least in that the first opening OP1 includes openings adjacent to each other in the first direction DR1 and extending in the second direction DR2.

According to one or more embodiments, first openings OP1 may be provided. The first openings OP1 may be sequentially arranged in a direction (for example, the first direction DR1) from the first end EP1 to the second end EP2 of the light emitting elements LD, and may extend in a direction (for example, the second direction DR2) in which the light emitting elements LD are sequentially arranged.

A structure of the pixel PXL according to the sixth embodiment for securing the outgassing path will be described with reference to FIG. 16. FIG. 16 is a plan view schematically illustrating area EA1 of FIG. 4, and illustrates the pixel PXL according to the sixth embodiment. Contents that may be repetitive with respect to the above-described contents will be briefly described or will not be repeatedly described, and differences from the previous embodiments will be mainly described.

The pixel PXL according to the sixth embodiment may be different from the pixel PXL according to the first embodiment at least in that the first opening OP1 includes openings sequentially arranged in the second direction DR2.

According to one or more embodiments, first openings OP1 may be provided and may be sequentially disposed under the extension connection electrodes RELT. For example, the first openings OP1 may be sequentially arranged in the direction in which the light emitting elements LD are sequentially arranged (for example, the second direction DR2), and may overlap the extension connection electrode RELT in a plan view.

Process management may be facilitated by disposing the first openings OP1 under the extension connection electrode RELT and changing the number of the first openings OP1 as necessary.

A structure of the pixel PXL according to the seventh embodiment for securing the outgassing path will be described with reference to FIG. 17. FIG. 17 is a plan view schematically illustrating area EA1 of FIG. 4, and illustrates the pixel PXL according to the seventh embodiment. Contents that may be repetitive with respect to the above-described contents will be briefly described or will not be repeatedly described, and differences from the previous embodiments will be mainly described.

The pixel PXL according to the seventh embodiment may be different from the pixel PXL according to the first embodiment at least in that the first opening OP1 is disposed between the emission parts EMU adjacent to each other in the second direction DR2.

According to one or more embodiments, for example, emission parts EMU may be disposed in an emission area EMA. An arrangement structure of the connection electrodes ELT for electrically connecting the emission parts EMU may be formed. A region in which the emission parts EMU (the light emitting elements LD) are not disposed in the emission area EMA may be formed. According to one or more embodiments, the first opening OP1 may be disposed in the region in which the light emitting elements LD are not disposed in the emission area EMA. According to one or more embodiments, the first opening OP1 may not overlap the emission parts EMU (or the light emitting elements LD) in a direction (for example, the first direction DR1) from the first end EP1 to the second end EP2 of the light emitting elements LD. According to one or more embodiments, the first opening OP1 may overlap the second opening OP2 and the third opening OP3 in a plan view.

A method of manufacturing the display device DD according to embodiments will be described with reference to FIGS. 18 to 23. Contents that may be repetitive with respect to the above-described contents will be briefly described or will not be repeatedly described.

FIGS. 18 to 23 are cross-sectional views schematically illustrating a method of manufacturing a display device according to an embodiment in each process step. FIGS. 18 to 23 may illustrate the cross-sectional structure described above with reference to FIG. 11. FIGS. 18 to 23 briefly illustrate the base layer BSL and the pixel circuit layer PCL for convenience of description.

Figure 18:
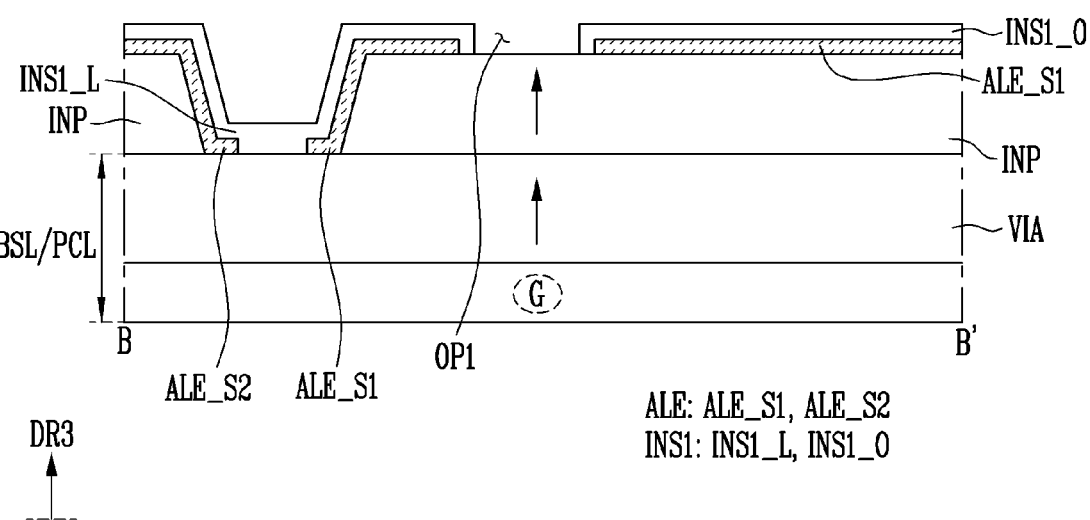
FIGS. 18 to 23 are cross-sectional views schematically illustrating a method of manufacturing a display device according to one or more embodiments in each process step.

Referring to FIG. 18, the base layer BSL may be provided (or prepared), and the pixel circuit layer PCL may be disposed on the base layer BSL. The insulating pattern INP may be disposed (or patterned) on the pixel circuit layer PCL, the electrodes ALE may be disposed (or patterned) on the insulating pattern INP, and the first insulating layer INS1 may be disposed (or patterned) on the electrodes ALE.

In this phase, components (for example, the pixel circuit layer PCL and the like) disposed on the base layer BSL may be formed by patterning a conductive layer (or a metal layer), an inorganic material, an organic material, or the like through a conventional process using a mask.

In this phase, although not shown separately in the drawings, after a base electrode is deposited on the pixel circuit layer PCL, at least a portion of the base electrode may be etched to pattern the first alignment electrode ALE_S1 and the second alignment electrode ALE_S2. According to one or more embodiments, the electrodes ALE may be deposited on the insulating patterns INP to form the reflective wall. According to one or more embodiments, the first alignment electrode ALE_S1 and the second alignment electrode ALE_S2 may extend in the second direction DR2 and may be patterned to be spaced apart from each other in the first direction DR1. Accordingly, a region in which the light emitting elements LD may be disposed may be defined between the first alignment electrode ALE_S1 and the second alignment electrode ALE_S2.

In this phase, the via layer VIA included in the pixel circuit layer PCL may be formed. For example, the via layer VIA may be a layer of the pixel circuit layer PCL that is most spaced apart from the base layer BSL. Since the via layer VIA may include an organic material, the gas G generated in the pixel circuit layer PCL may pass through the via layer VIA.

In this phase, the insulating pattern INP may be patterned to contact an upper portion of the via layer VIA, and a portion of the insulating pattern INP may form an inclined surface.

In this phase, the first element insulating layer INS1_L and the first opening-forming insulating layer INS1_O may be patterned. The first opening-forming insulating layer INS1_O may form the first opening OP1 to expose a surface of the insulating pattern INP.

According to one or more embodiments, the via layer VIA and the insulating pattern INP may contact each other, and the insulating pattern INP may be directly adjacent to the first opening OP1. Accordingly, the gas G may pass through the via layer VIA and the insulating pattern INP and may be discharged through the first opening OP1

Figure 19:
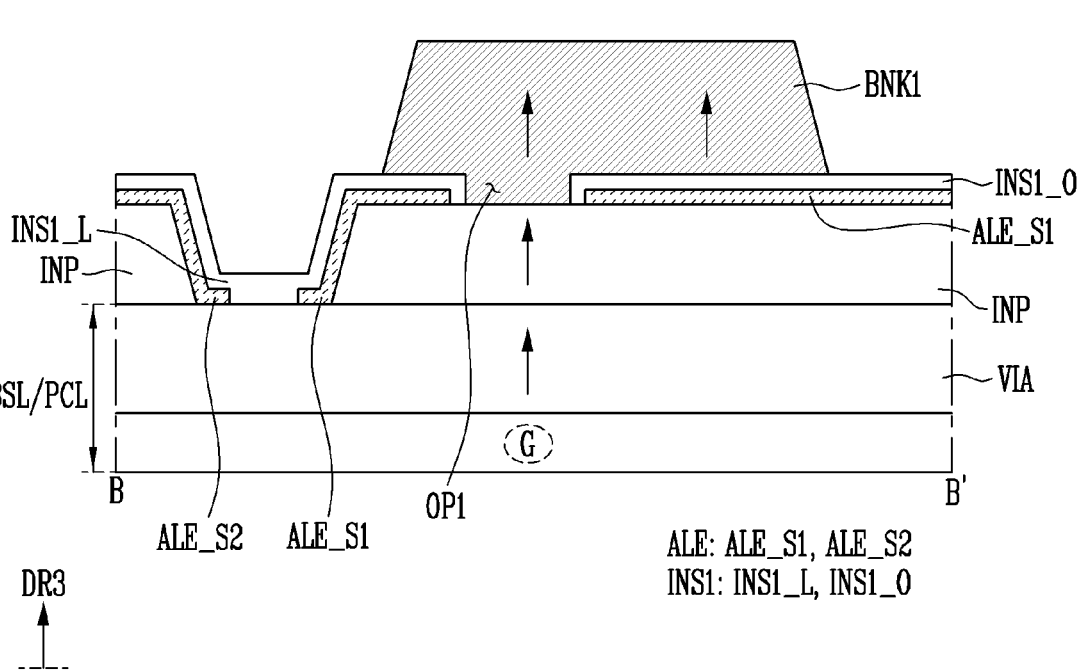

Referring to FIG. 19, the first bank BNK1 may be disposed on the first insulating layer INS1. The first bank BNK1 may define a space to which a fluid may be supplied.

In this phase, a portion of the first bank BNK1 may be patterned on the first opening-forming insulating layer INS1_O. At least a portion of the first bank BNK1 may be provided (or filled) into the first opening OP1. Accordingly, the first bank BNK1 may contact the insulating pattern INP through the first opening OP1. Since the first bank BNK1 may include an organic material, the gas G may pass through the first bank BNK1. Accordingly, the gas G may pass through the via layer VIA and the insulating pattern INP, may be applied to the first bank BNK1 through the first opening OP1, and may be discharged to the outside.

Figure 20:
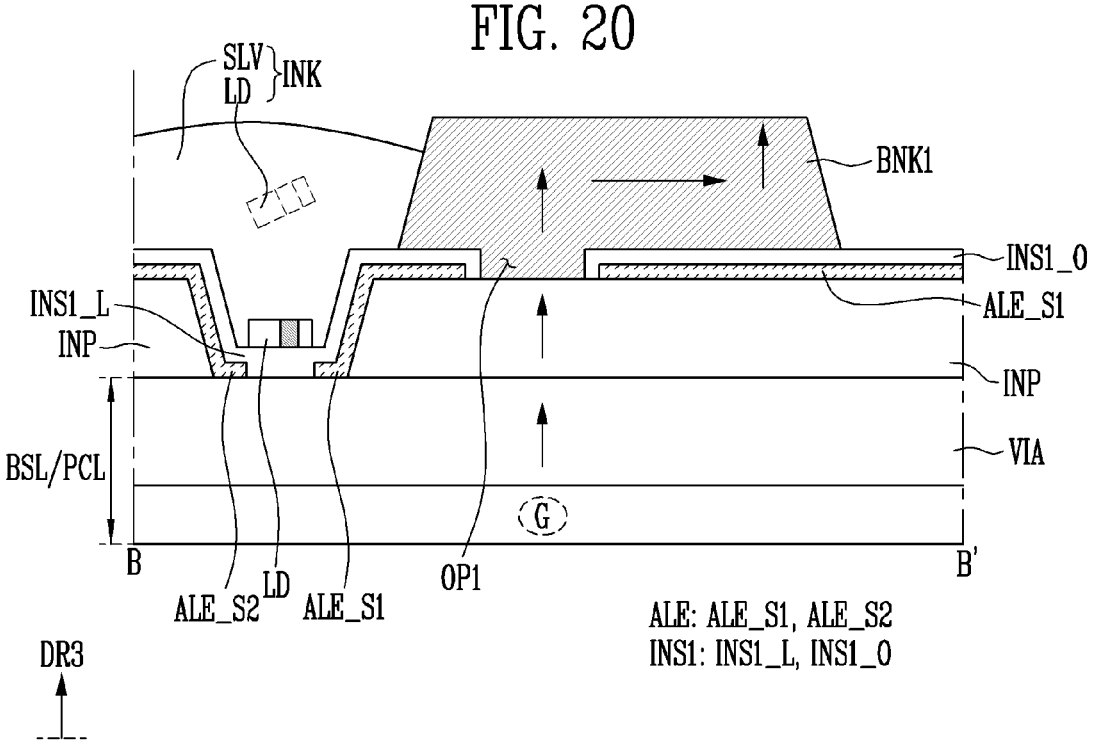

Referring to FIG. 20, the light emitting elements LD may be disposed (or aligned) on the first element insulating layer INS1_L.

In this phase, ink INK including the light emitting elements LD may be supplied to the space which is defined by the first bank BNK1 and in which a fluid may be accommodated. For example, the ink INK including the light emitting elements LD and a solvent SLV may be supplied on the base layer BSL by a printing device configured to eject a fluid. According to one or more embodiments, the solvent SLV may include an organic solvent. For example, the solvent SLV may be at least one of Propylene Glycol Methyl Ether Acetate (PGMEA), Dipropylen Glycol n-Propyl Ether (DGPE), and Triethylene Gylcol n-Butyl Ether (TGBE). However, the disclosure is not limited to the above-described examples.

In this phase, the ink INK may be accommodated in the space defined by the first bank BNK1, and the alignment signals may be supplied to the electrodes ALE. The light emitting elements LD may be aligned based on an electric field according to the alignment signals. As described above, the first alignment signal may be supplied to the first alignment electrode ALE_S1 and the second alignment signal may be supplied to the second alignment electrode ALE_S2, so that the light emitting elements LD may be aligned between the first alignment electrode ALE_S1 and the second alignment electrode ALE_S2. Thereafter, the solvent SLV may be removed.

Figure 21:
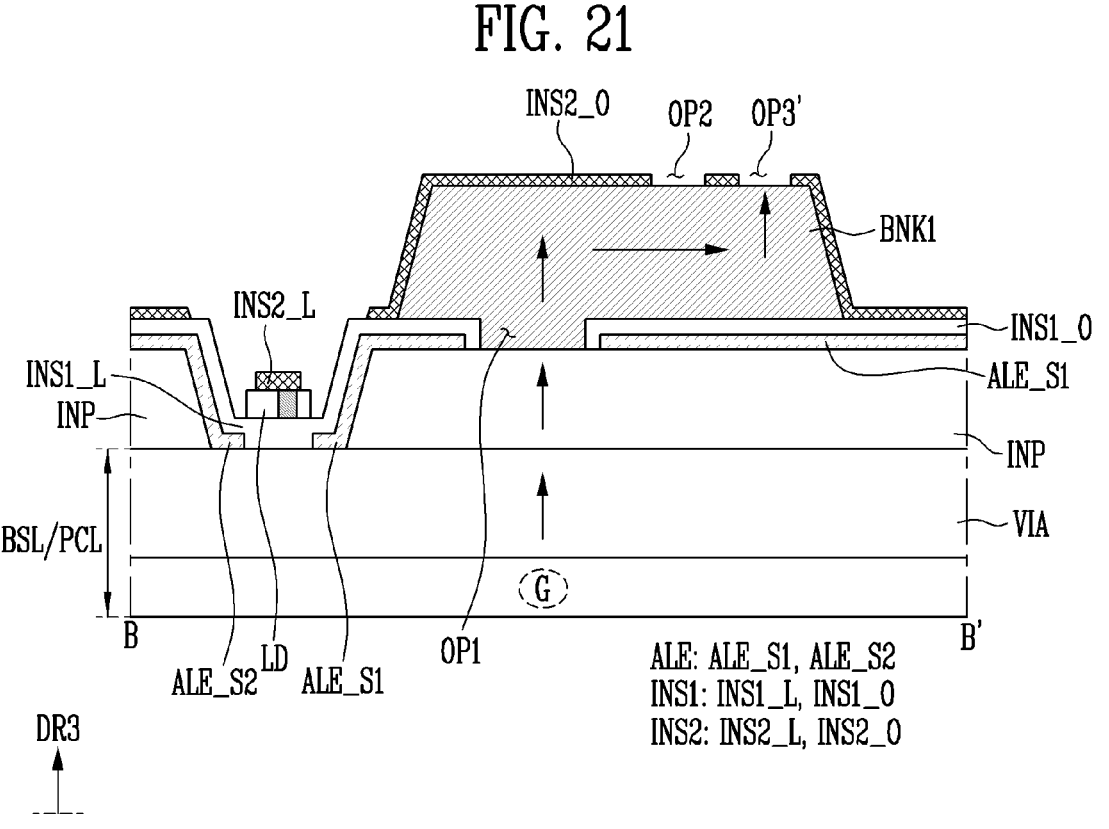

Referring to FIG. 21, the second insulating layer INS2 may be patterned. For example, the second element insulating layer INS2_L may be disposed on the light emitting elements LD, and the second opening-forming insulating layer INS2_O may be disposed on the first insulating layer INS1 or the first bank BNK1.

According to one or more embodiments, the second opening-forming insulating layer INS2_O may form the second opening OP2 and a preliminary opening OP3'. However, according to one or more embodiments, the formation of the third preliminary opening OP3' may be omitted. The second opening OP2 may expose at least a portion of the first bank BNK1. The preliminary opening OP3' may expose at least a portion of the first bank BNK1. Accordingly, the gas G may pass through the via layer VIA and the insulating pattern INP, may be applied to the first bank BNK1 through the first opening OP1, and may be discharged to the outside through the second opening OP2 (the second opening OP2 and the preliminary opening OP3').

Figure 22:
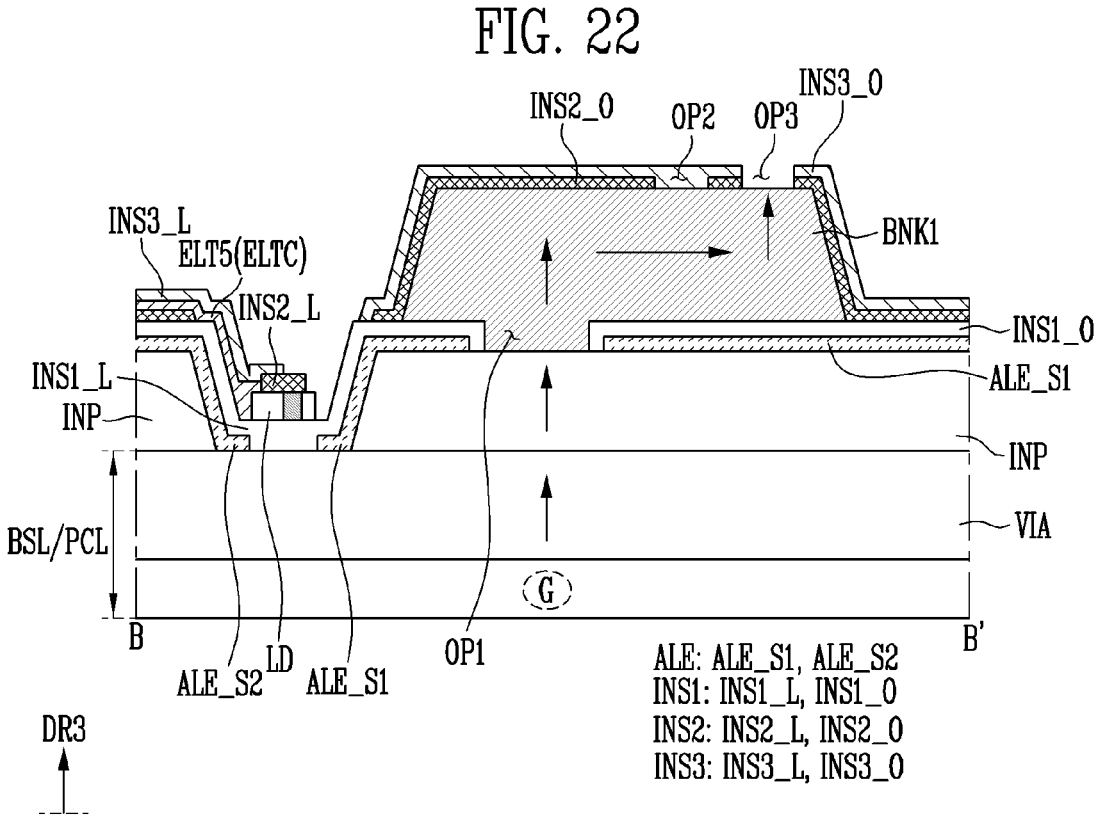

Referring to FIG. 22, a portion of the connection electrode ELT may be patterned, and the third insulating layer INS3 may be patterned. For example, the cathode connection electrode ELTC (for example, a first connection electrode) electrically connected to the light emitting element LD may be disposed. The third element insulating layer INS3_L may be disposed on the portion of the connection electrode ELT (for example, the cathode connection electrode ELTC), and the third opening-forming insulating layer INS3_O may be disposed on the first insulating layer INS1, the second opening-forming insulating layer INS2_O, and the first bank BNK1.

According to one or more embodiments, the third opening-forming insulating layer INS3_O may form the third opening OP3. According to one or more embodiments, the third opening OP3 may be formed at a position where the preliminary opening OP3' is formed in the above-described step. As another example, in case that the preliminary opening OP3' is not formed, the third opening OP may be provided by simultaneously patterning (etching) a portion of the second insulating layer INS2 and a portion of the third insulating layer INS3. The third opening OP3 may expose at least a portion of the first bank BNK1. Accordingly, the gas G may pass through the via layer VIA and the insulating pattern INP, may be applied to the first bank BNK1 through the first opening OP1, and may be discharged to the outside through the third opening OP3.

Figure 23:
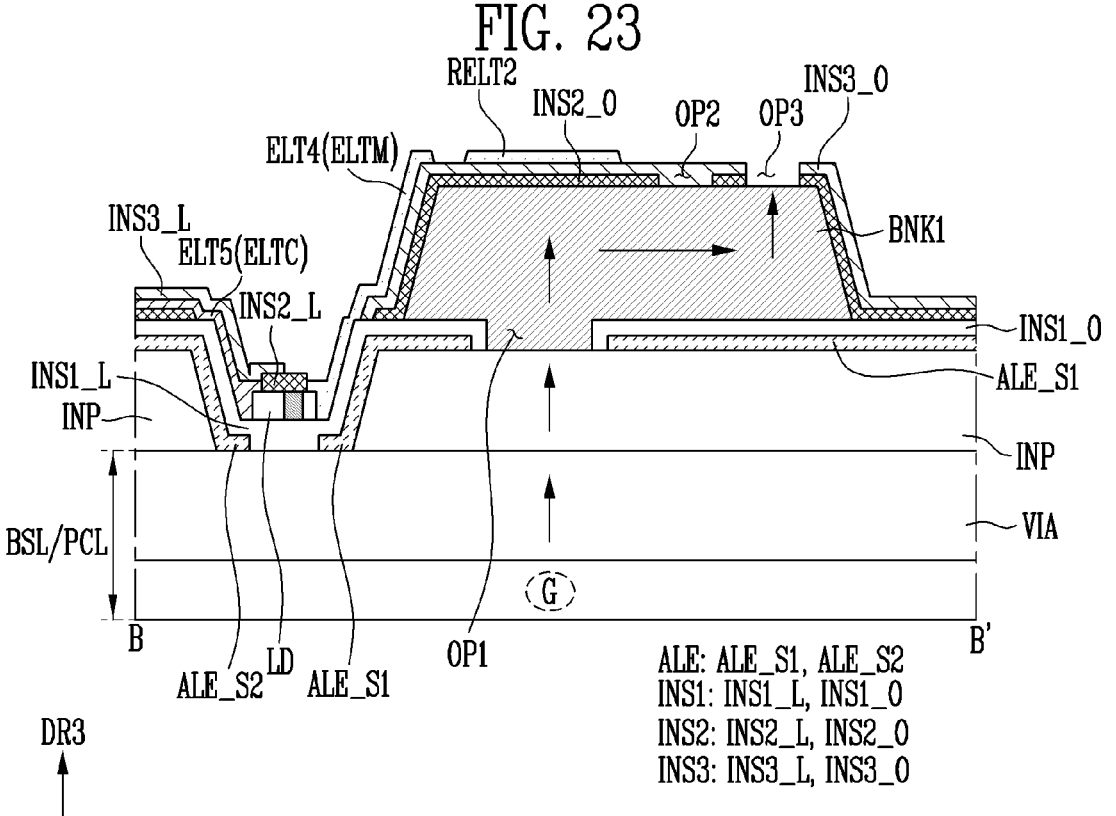

Referring to FIG. 23, another portion of the connection electrode ELT may be patterned. For example, the intermediate connection electrode ELTM (for example, a second connection electrode) electrically connected to the light emitting element LD may be disposed.

In this phase, the extension connection electrode RELT may be patterned. The extension connection electrode RELT may be patterned to overlap the first opening OP1 in a plan view. According to one or more embodiments, the extension connection electrode RELT may be patterned so as not to overlap the third opening OP3. Accordingly, the gas G may pass through the via layer VIA and the insulating pattern INP, may be applied to the first bank BNK1 through the first opening OP1, and may be discharged to the outside through the third opening OP3. Due to the outgassing path formed in this way, the gas G inside the pixel circuit layer PCL may be efficiently discharged, so that a risk due to the gas G such as a lifting of a layer can be prevented.

Thereafter, although not shown separately in the drawings, the display device DD according to the embodiments may be manufactured by providing the color conversion layer CCL, the color filter layer CFL, and the like.

According to the embodiments of the disclosure, a display device in which an outgassing path can be sufficiently secured and a method of manufacturing the same may be provided.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
electrodes on a base layer;
a first insulating layer on the electrodes;
a bank directly on the first insulating layer, protruding in a thickness direction of the base layer, and surrounding a region;
light emitting elements disposed in the region on the base layer; and
connection electrodes electrically connected to the light emitting elements, wherein
the connection electrodes include:
an anode connection electrode electrically connected to the light emitting elements;
a cathode connection electrode electrically connected to the light emitting elements; and
an extension connection electrode on the bank,
the first insulating layer forms at least one first opening,
the at least one first opening overlaps the extension connection electrode in a plan view, and
wherein at least a portion of the bank is disposed in the at least one first opening.

2. The display device of claim 1, further comprising:
a via layer on the base layer;
insulating patterns under the electrodes on the via layer;
a second insulating layer, at least a portion of which is on the bank and which forms a second opening exposing the bank; and
a third insulating layer, at least a portion of which is on the bank and which forms a third opening exposing the bank,
wherein the at least one first opening exposes the insulating patterns.

3. The display device of claim 2, wherein each of the via layer, the bank, and the insulating patterns includes an organic material.

4. The display device of claim 2, wherein
the insulating patterns and the bank contact each other in the at least one first opening, and
the insulating patterns and the via layer contact each other.

5. The display device of claim 2, wherein the via layer, the insulating patterns, and the bank form an outgassing path that allows gas to pass therethrough.

6. The display device of claim 2, wherein
a portion of the at least one first opening overlaps the second opening in a plan view, and
another portion of the at least one first opening overlaps the third opening in a plan view.

7. The display device of claim 2, wherein
portions of the connection electrodes not on the bank and the extension connection electrode are disposed to surround a region, and
the third opening is in the region.

8. The display device of claim 1, wherein
the light emitting elements include a first end and a second end, and the at least one first opening is arranged in a direction from the first end to the second end, and extends in a direction in which the light emitting elements are sequentially arranged.

9. The display device of claim 1, further comprising:

a color conversion layer on the light emitting elements and including quantum dots; and a color filter layer on the light emitting elements and selectively transmitting light of a color.

10. A display device comprising:

electrodes on a base layer;

a first insulating layer on the electrodes and forming at least one first opening;

a bank directly on the first insulating layer and protruding in a thickness direction of the base layer;

light emitting elements in a region surrounded by the bank; and a second insulating layer, at least a portion of which is on the bank and forms a second opening and another portion of which is directly on the first insulating layer, wherein the at least one first opening and the second opening do not overlap each other in a plan view, and wherein at least a portion of the bank is disposed in the at least one first opening.

11. The display device of claim 10, further comprising:

a third insulating layer, at least a portion of which is on the second insulating layer and forms a third opening, wherein the at least one first opening and the third opening do not overlap each other in a plan view.

12. The display device of claim 11, wherein, the light emitting elements are sequentially arranged in a direction, the second opening is not between two of the at least one first opening in the direction, and the third opening is between the two of the at least one first opening in the direction.

13. The display device of claim 11, wherein the at least one first opening does not overlap the light emitting elements in a direction from a first end to a second end of each of the light emitting elements in a plan view.

14. A method of manufacturing a display device comprising:

disposing a via layer on a base layer;

disposing an insulating pattern on the via layer;

patterning electrodes on the insulating pattern;

disposing a first insulating layer forming at least one first opening on the electrodes and the insulating pattern;

disposing a bank protruding in a thickness direction of the base layer directly on the first insulating layer;

disposing light emitting elements in a region surrounded by the bank on the first insulating layer;

disposing a second insulating layer forming a second opening on the bank;

patterning a first connection electrode electrically connected to the light emitting elements;

disposing a third insulating layer forming a third opening;

patterning a second connection electrode electrically connected to the light emitting elements; and patterning an extension connection electrode disposed on the bank, wherein the extension connection electrode overlaps the at least one first opening in a plan view, and wherein at least a portion of the bank is disposed in the at least one first opening.

15. The method of claim 14, wherein a portion of the third insulating layer is on the first connection electrode, and another portion of the third insulating layer is on the bank.

16. The method of claim 15, wherein the extension connection electrode is integral with the second connection electrode.

17. The method of claim 16, wherein the disposing of the light emitting elements includes:

providing an electrical signal to the electrodes so that the light emitting elements are aligned based on an electric field according to the electrical signal.

18. The method of claim 16, wherein each of the via layer, the bank, and the insulating pattern includes an organic material.

19. The method of claim 16, wherein the disposing of the bank includes connecting the bank and the insulating pattern with each other in the at least one first opening, and each of the second opening and the third opening exposes the bank.

20. The method of claim 16, wherein the second opening and the third opening do not overlap each other in a plan view.

* * * * *